(12) United States Patent
Chang et al.

(10) Patent No.: US 11,908,708 B2
(45) Date of Patent: Feb. 20, 2024

(54) LASER DE-BONDING CARRIERS AND COMPOSITE CARRIERS THEREOF

(71) Applicant: Taiwan Semiconductor Manufacturing Co., Ltd., Hsinchu (TW)

(72) Inventors: Huicheng Chang, Tainan (TW); Jyh-Cherng Sheu, Hsinchu (TW); Chen-Fong Tsai, Hsinchu (TW); Yun Chen Teng, New Taipei (TW); Han-De Chen, Hsinchu (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 36 days.

(21) Appl. No.: 17/479,467

(22) Filed: Sep. 20, 2021

(65) Prior Publication Data
US 2022/0406621 A1 Dec. 22, 2022

Related U.S. Application Data

(60) Provisional application No. 63/211,723, filed on Jun. 17, 2021.

(51) Int. Cl.
*H01L 21/56* (2006.01)
*H01L 25/065* (2023.01)
*H01L 25/00* (2006.01)
(52) U.S. Cl.
CPC ......... *H01L 21/568* (2013.01); *H01L 21/561* (2013.01); *H01L 25/0652* (2013.01); *H01L 25/50* (2013.01)

(58) Field of Classification Search
CPC . H01L 21/568; H01L 21/561; H01L 25/0652; H01L 25/50
See application file for complete search history.

(56) References Cited

U.S. PATENT DOCUMENTS

| | | | |
|---|---|---|---|
| 5,089,438 A * | 2/1992 | Katz ................. | H01L 21/28575 438/606 |
| 5,936,296 A | 8/1999 | Park et al. | |
| 2007/0190711 A1* | 8/2007 | Luo ................... | H01L 21/28202 438/585 |

(Continued)

FOREIGN PATENT DOCUMENTS

| | | | | |
|---|---|---|---|---|
| EP | 1160880 B1 * | 7/2012 | ......... | H01L 31/1828 |
| JP | 5629898 B2 * | 11/2014 | ............ | C08F 220/28 |
| KR | 20200091864 A | 7/2020 | | |

(Continued)

OTHER PUBLICATIONS

Google Patents Translation TW 2019 36411 A, downloaded Mar. 16, 2023.*

*Primary Examiner* — Michael Lebentritt
(74) *Attorney, Agent, or Firm* — Slater Matsil, LLP

(57) ABSTRACT

A method includes bonding a package component to a composite carrier. The composite carrier includes a base carrier and an absorption layer, and the absorption layer is between the base carrier and the package component. A laser beam is projected onto the composite carrier. The laser beam penetrates through the base carrier to ablate the absorption layer. The base carrier may then be separated from the package component.

20 Claims, 25 Drawing Sheets

(56) References Cited

U.S. PATENT DOCUMENTS

2010/0051893 A1\* 3/2010 Kim .................... H10N 70/041
  257/E47.001
2020/0399506 A1 12/2020 Miyazawa et al.

FOREIGN PATENT DOCUMENTS

| TW | 360901 | B | | 6/1999 | | |
|----|--------|---|---|--------|---|---|
| TW | 365701 | B | | 8/1999 | | |
| TW | 201936411 | A | | 9/2019 | | |
| TW | 202111806 | A | \* | 3/2021 | ....... | H01L 21/02046 |
| WO | WO-2014006878 | A1 | \* | 1/2014 | ............ | C08F 220/28 |

\* cited by examiner

LASER DE-BONDING CARRIERS AND COMPOSITE CARRIERS THEREOF

PRIORITY CLAIM AND CROSS-REFERENCE

This application claims the benefit of the following provisionally filed U.S. Patent application: Application No. 63/211,723, filed on Jun. 17, 2021, and entitled "IR Laser to De-Bond Permanent Bonded Wafers for Backside Power Delivery Application," which application is hereby incorporated herein by reference.

BACKGROUND

Carriers are commonly used in the packaging of integrated circuits as a supporting mechanism, on which device dies are placed and molded. Carriers may be bonded to other package component through temporary bonding or permanent bonding. The temporary bonding was typically performed through Light-To-Heat-Conversion (LTHC) coatings, which adhere the carriers with the package components bonded thereon. The LTHC may be decomposed using laser, so that carrier may be de-bonded with the package components. The permanent bonding may be performed through fusion bonding. After the bonding is made, the de-bonding of the wafer from the respective package components needs to be performed by destructing the carrier, which may be removed through chemical mechanical polish, grinding, dry or wet etching processes, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
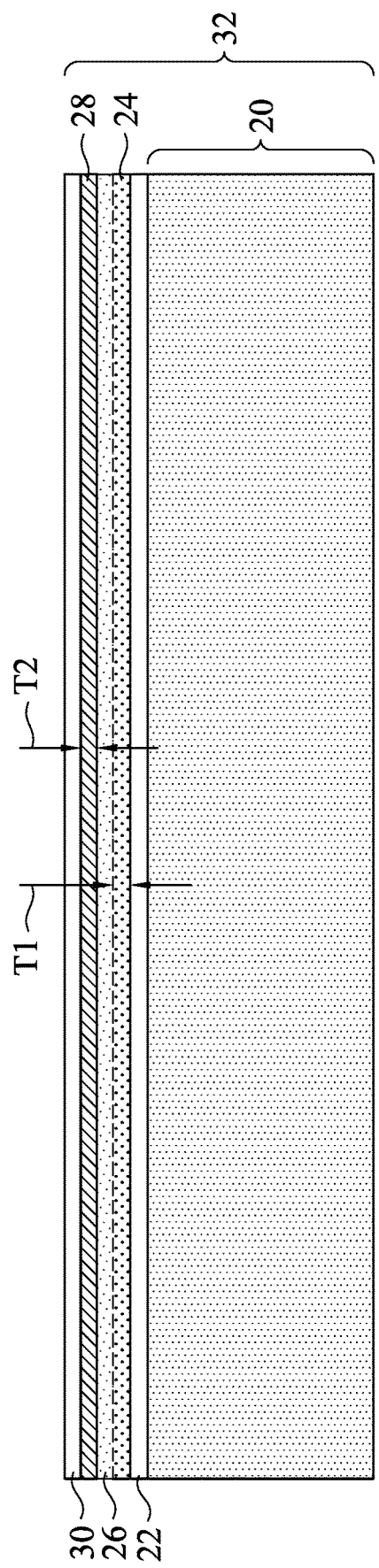
FIGS. 1A, 1B, and 2-7 illustrate the cross-sectional views of intermediate stages in the bonding of a carrier with a device substrate and a subsequent de-bonding process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A composite carrier and the method of de-bonding permanently bonded composite carrier are provided. In accordance with some embodiments of the present disclosure, a composite carrier is bonded with a package component. The composite carrier comprises a base carrier, and an absorption layer over the base carrier. A laser ablation process is performed using a laser beam that is configured to penetrate and not absorbed by the base carrier, and is absorbed by the absorption layer. Accordingly, the absorption layer is ablated, and the base carrier may be de-bonded from the package component. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1A, 1B, and 2-7 illustrate the cross-sectional views of intermediate stages in the bonding a device substrate with a composite carrier and a subsequent de-bonding process in accordance with some embodiments of the present disclosure. The corresponding processes are also reflected schematically in the process flow 200 shown in FIG. 24.

Figure 24:
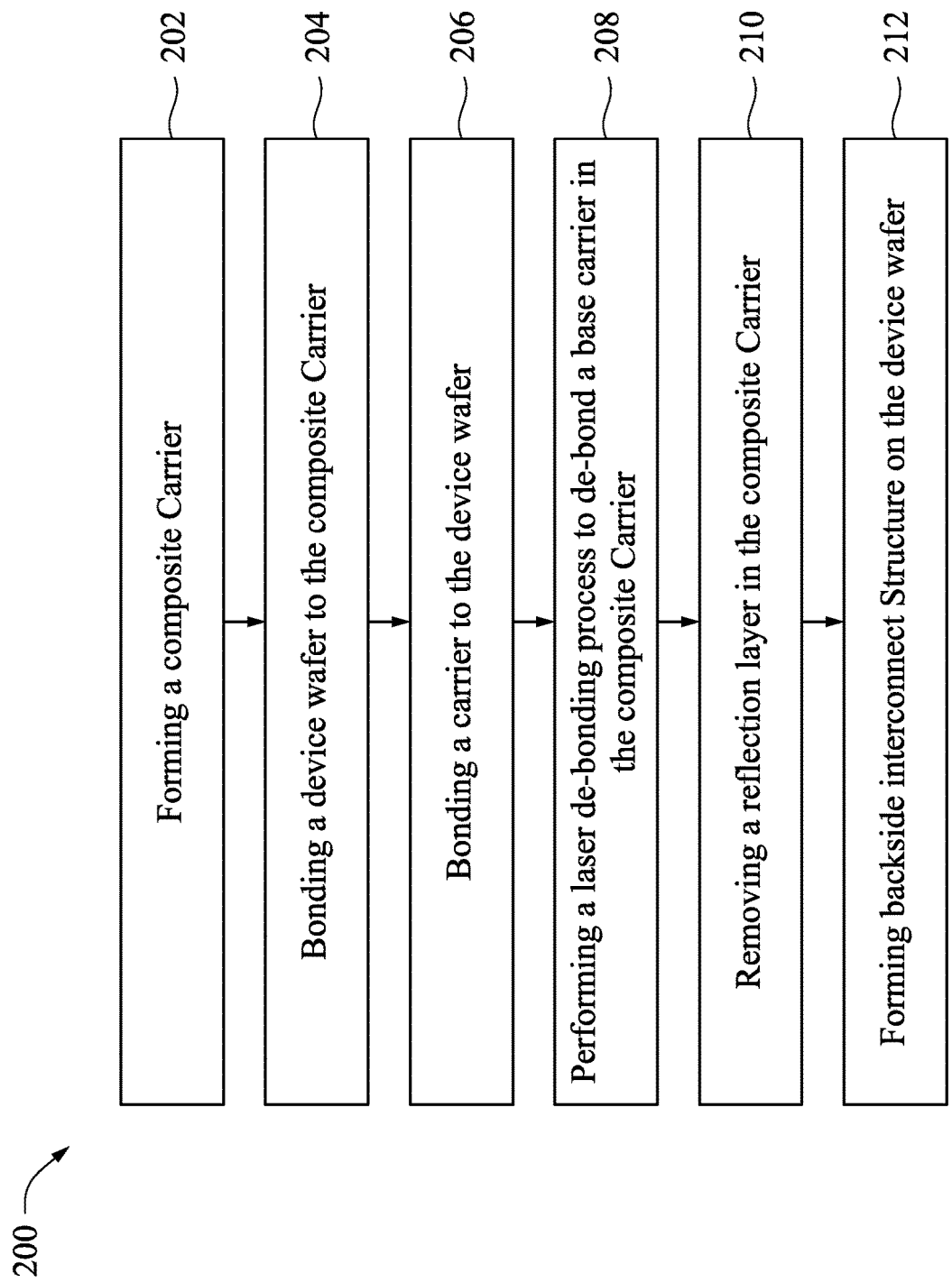
FIG. 24 illustrates a process flow for the bonding and de-bonding of a carrier and a device substrate in accordance with some embodiments.

Referring to FIG. 1A, composite carrier 32 is formed. The respective process is illustrated as process 202 in the process flow 200 as shown in FIG. 24. First, base carrier 20 is provided. Base carrier 20 is formed of a material that is transparent to the laser beam used in a subsequent de-bonding process. Throughout the description, when a layer is referred to as being "transparent" to laser, it indicates the corresponding material does not absorb the energy of the laser beam, for example, with the absorptance (also referred to as absorption rate) being lower than about 10 percent, about 5 percent, about 2 percent, or about 1 percent. In accordance with some embodiments, base carrier 20 may be formed of or comprise silicon, while other materials such as glass, silicate glass, or the like, may also be used. In accordance with some embodiments, the entire base carrier 20 is formed of a homogeneous material, with no other material different from the homogeneous material therein. For example, the entire base carrier 20 may be formed of silicon (doped or undoped), and there is no metal region, dielectric region, etc., in base carrier 20.

Further referring to FIG. 1A, layer 22 is formed on base carrier 20. In accordance with some embodiments, layer 22 is formed of a material that is transparent to the laser beam used in a subsequent de-bonding process. In accordance with some embodiments, layer 22 is formed of or comprises an oxide-based material, which may be silicon oxide, while other materials such as phospho-silicate glass (PSG), boro-silicate glass (BSG), boron-doped phospho silicate glass (BPSG), fluorine-doped silicate glass (FSG), or the like, may be used. Layer 22 may be deposited using thermal oxidation of silicon, Chemical Vapor Deposition (CVD), Plasma Enhanced Chemical Vapor Deposition (PECVD), Low Pressure Chemical Vapor Deposition (LPCVD), Atomic Layer Deposition (ALD), or the like.

Absorption layer 24 is deposited over layer 22. Absorption layer 24 is formed of a material that may absorb the energy of laser, as will be discussed in subsequent process. In accordance with some embodiments, absorption layer 24 is a metal-containing layer, which may be a metal layer, a metal compound layer, or the composite layer comprising a plurality of layers. In accordance with some embodiments, absorption layer 24 comprises titanium nitride (TiN). In accordance with alternative embodiments, absorption layer 24 comprises titanium (Ti). In accordance with yet alternative embodiments, absorption layer 24 comprises TiN/Ti/TiN, which includes a titanium layer sandwiched between two titanium nitride layers. The formation of absorption layer 24 may include CVD, PVD, ALD, PECVD, or the like.

Figure 17:
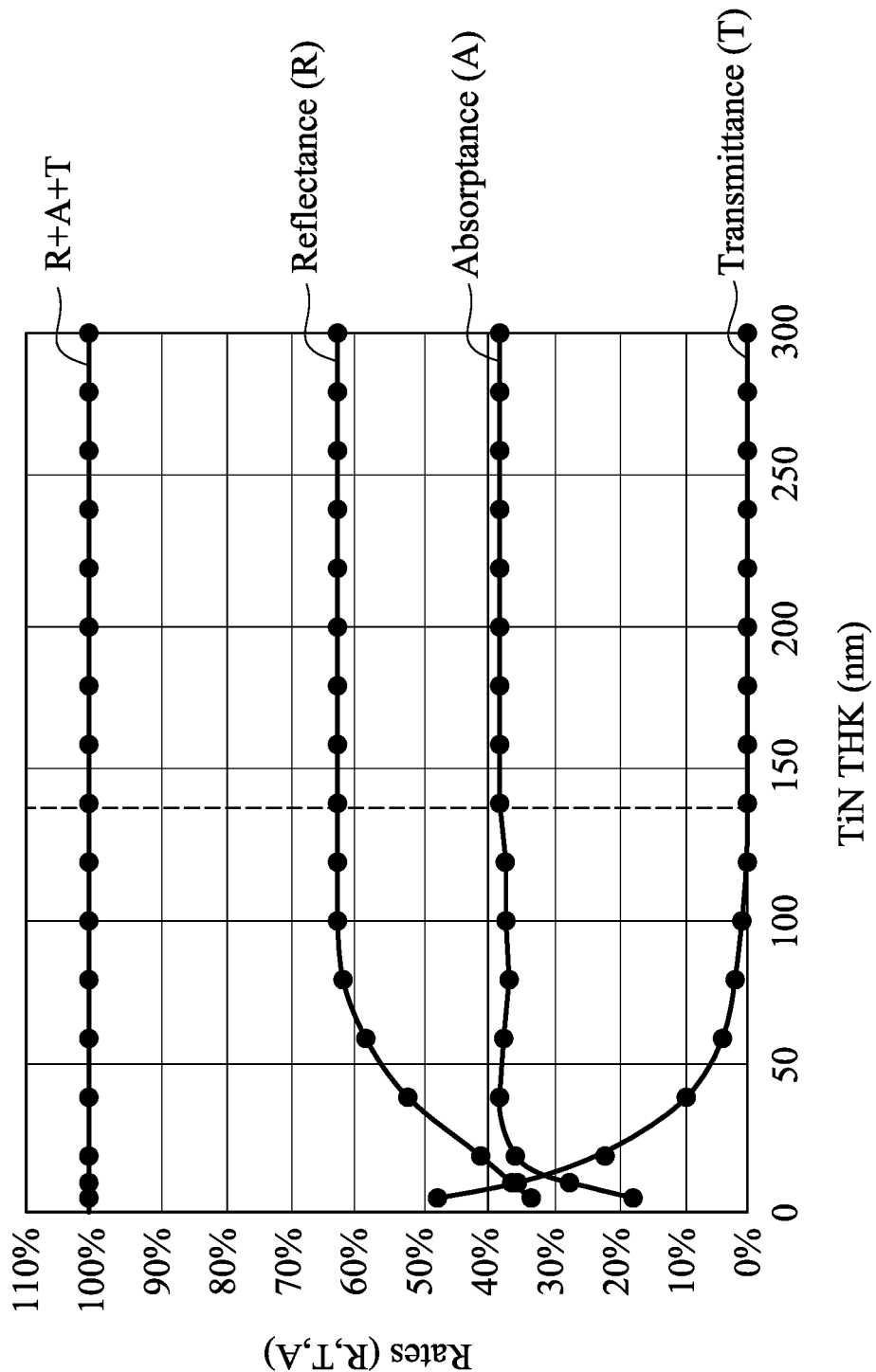
FIG. 17 illustrates the reflectance, absorptance, and transmittance of titanium nitride films as a function of their thicknesses in accordance with some embodiments.

Absorption layer 24 is used to absorb laser energy in the subsequent de-bonding process, so that absorption layer 24 is ablated. Accordingly, the material of absorption layer 24 is selected to have a high absorptance of laser energy. FIG. 17 illustrates the reflectance (represented as R), absorptance (represented as A), and transmittance (represented as T) of TiN layers as functions of the thicknesses of the corresponding TiN layers. The reflectance, the absorptance, and the transmittance are percentages. FIG. 17 is obtained by using an Infrared (IR) laser having wavelengths in the range between about 1,800 nm and about 2,200 nm. The reflectance, absorptance, and transmittance reflect that when a laser beam is projected on the TiN layer, how much percentage of laser beam energy is reflected, absorbed, and penetrates-through. It is appreciated that the reflectance, absorptance, and transmittance are related to the wavelength of the laser beam, and when a laser beam with a different wavelength is used, different rates will be obtained.

As shown in FIG. 17, the absorptance of TiN is small when the corresponding TiN is thin, and rises to about 35 percent when the thickness of the TiN layer increases. The absorptance of TiN saturates at about 38 percent, which means about 38 percent of the corresponding energy is absorbed. This is a high value for a metal-containing absorption layer.

The reflectance of TiN is low when the corresponding TiN layer is thin. For example, when the thickness of a TiN layer is about 25 nm, the reflectance is about 40 percent, and when the thickness increases, the reflectance increases to over 60 percent. This means a thin TiN layer is generally better for reducing the reflection.

Furthermore, the transmittance is high when the corresponding TiN layer is thin. When the thickness increases, the transmittance reduces also, and reduces to zero when the thickness of the TiN layer is greater than about 140 nm. The total ("R+A+T") of absorptance, the reflectance, and the transmittance is equal to 100 percent.

As shown in FIG. 17, the absorptance affects the percentage of the laser energy absorbed by the absorption layer 24, and hence absorption layer 24 cannot be too thin, otherwise, the absorptance is too low. On the other hand, absorption layer 24 cannot be too thick, otherwise, the absorbed energy is spread throughout the thick absorption layer 24, and the temperature of absorption layer 24 cannot increase high enough to achieve ablation. In accordance with some embodiments, the thickness T1 (FIG. 1A) of absorption layer 24 may be in the range between about 15 nm and about 100 nm when TiN is used as the absorption layer. Similarly, when absorption layer 24 comprises a TiN/Ti/TiN composite layer, the thickness of absorption layer 24 may be in the range between about 15 nm and about 100 nm.

When titanium is used to form absorption layer 24, a surface layer of titanium may be oxidized to form titanium oxide as a native oxide. Accordingly, the titanium layer is generally deposited to be thicker, so that even if the oxidation occurs, the remaining un-oxidized titanium is still thick enough to function as the absorption layer 24. Alternatively stated, a titanium absorption layer 24 is to have an increased thickness to leave allowance for undesirable oxidation. The thickness of the titanium absorption layer 24 may be in the range between about 30 nm and about 100 nm.

FIG. 1A further illustrates the formation of pad layer 26 and reflection layer 28 in accordance with some embodiments. Pad layer 26 may also be formed of a material that is transparent to the subsequently used laser beam used for de-bonding, for example, with an absorptance being smaller than about 5 percent or 2 percent. In accordance with some embodiments, pad layer 26 is formed of or comprises a silicon-based material such as silicon oxide, PSG, BSG, BPSG, FSG, or the like. Pad layer 26 may be deposited using PECVD, LPCVD, ALD, or the like.

Reflection layer 28 is deposited over pad layer 26. Reflection layer 28 is formed of a material that may reflect most of the energy of the laser beam, and has a low absorptance. In accordance with some embodiments, reflection layer 28 is formed of or comprises a metallic layer, a metal alloy layer, or a composite layer comprising metal layer(s), metal compound layer(s) and/or metal alloy layer(s). In accordance with some embodiments, reflection layer 28 has a reflectance greater than about 80 percent, greater than about 90 percent, or greater than about 95 percent.

Figure 18:
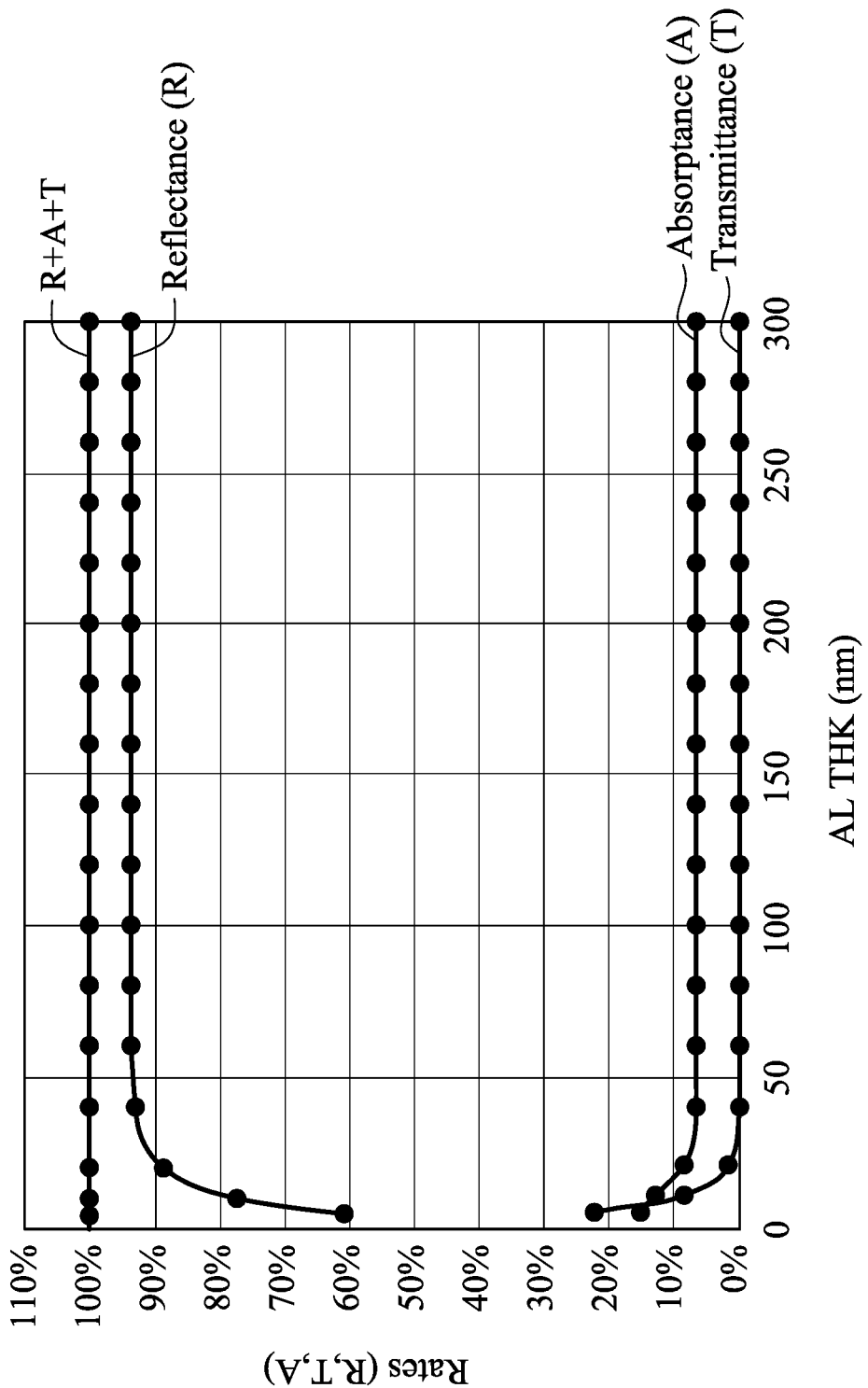
FIG. 18 illustrates the reflectance, absorptance, and transmittance of aluminum films as a function of their thicknesses in accordance with some embodiments.

FIG. 18 illustrates the reflectance, absorptance, and transmittance of aluminum as functions of the thicknesses of the corresponding aluminum layers. FIG. 18 is obtained by using an Infrared (IR) laser having a wavelength in the range between about 1,800 nm and about 2,200 nm. As shown in FIG. 18, the reflectance of aluminum is low when the corresponding aluminum layer is thin, and rises when the thickness of the aluminum layer increases. The reflectance of aluminum saturates at about 93 percent when the thickness of the aluminum layer is greater than about 50 nm, which means about 93 percent of the corresponding laser energy is reflected. On the other hand, with the increase in the thickness of the aluminum layer, both of the transmittance and the absorptance are reduced, and are very low when the thickness of the aluminum layer is thicker than about 50 nm. The thickness T2 of reflection layer 28 (as shown in FIG. 1A) may thus be selected to be greater than about 50 nm to achieve high reflectance. Thickness T2 may also be in the range between about 50 nm and about 100 nm. While greater thickness T2 may be adopted, the reflectance saturates.

There are some other metallic materials that demonstrate high reflectance, low transmittance, and low absorptance, which metallic materials may also be used for forming the reflection layer. For example, when the laser wavelength is in the range between about 1,000 nm and about 5,000 nm, copper has the reflectance between about 90 percent and about 98 percent, and silver has the reflectance between about 97 percent and about 99 percent. Gold also has a high reflectance. Accordingly, reflection layer 28 (FIG. 1A) may be formed of or comprise aluminum, copper, silver, gold, or the like, alloys thereof, and/or composite layers thereof. In accordance with some embodiments, reflection layer 28 has a metal percentage greater than about 90 percent or greater than about 95 percent, with the metal being aluminum, copper, silver, gold, or the like, or alloys thereof.

There are also some other metals such as steel, nickel, zinc, or the like, which may have low reflectance around 60 to 70 percent when the laser wavelength is about 1,000 nm, but the reflectance values increase to over 90 percent when the wavelength is about 5,000 nm. Accordingly, reflection layer 28 may also be formed of or comprise steel, nickel, zinc, or the like when the wavelength of the laser beam is high, for example, at around 1,800 nm and about 2,200 nm, or higher.

Referring back to FIG. 1A, bond layer 30 is deposited on reflection layer 28. In accordance with some embodiments, bond layer 30 is formed of or comprises a silicon-containing dielectric material, which may be formed of or comprises silicon oxide, silicon oxynitride (SiON), silicon oxycarbide (SiOC), silicon nitride (SiN), silicon carbide (SiC), silicon carbo-nitride (SiCN), or the like. In accordance with some embodiments of the present disclosure, bond layer 30 is formed using PECVD, CVD, LPCVD, ALD, or the like. Throughout the description, the structure in FIG. 1A is referred to as composite carrier 32.

Each of the layer 22, transparent layer 24, pad layer 26, reflection layer 28 and bond layer 30 may be a planar layer. The entire top surface and entire bottom surface of each of layer 22, absorption layer 24, pad layer 26, reflection layer 28, and bond layer 30 may be planar, and extend to the edges of base layer 20.

Figure 1B:
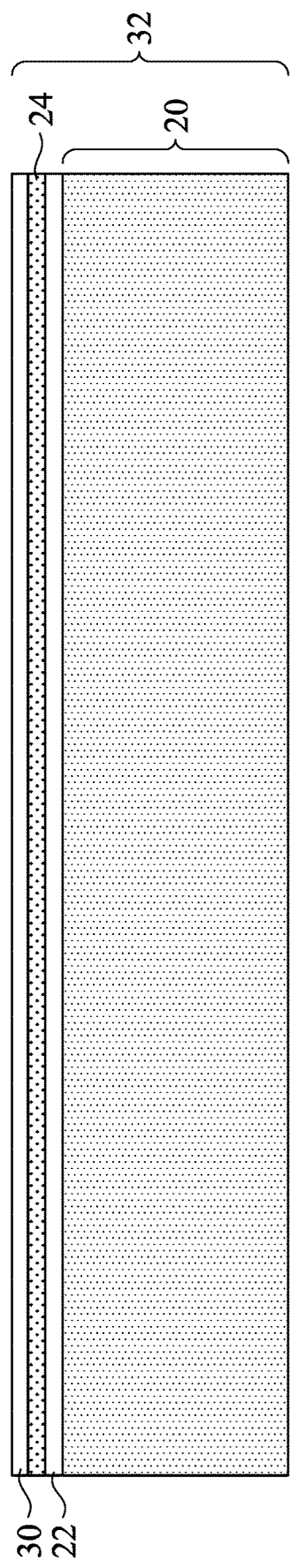

FIG. 1B illustrates composite carrier 32 in accordance with alternative embodiments. The composite carrier 32 in accordance with these embodiments is similar to the embodiments shown in FIG. 1A, except that reflection layer 28 is not formed. Pad layer 26 may also be omitted accordingly. Bond layer 30 is accordingly in contact with absorption layer 24 in accordance with these embodiments. In the following discussed FIGS. 2 through 7, reflection layer 28 and pad layer 26 are shown using dashed lines to indicate that these layers may be, or may not be, formed.

Figure 2:
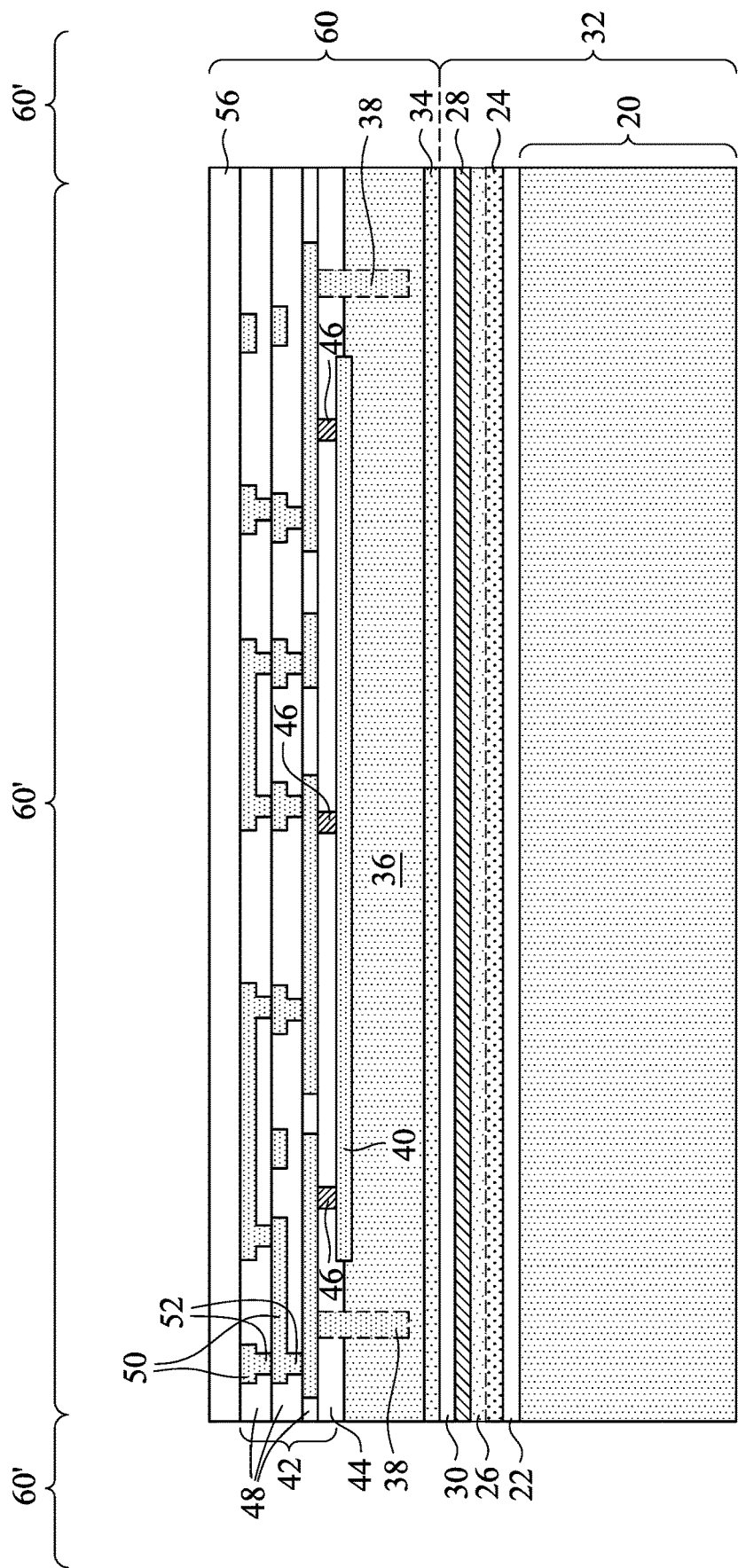

FIG. 2 illustrates the bonding of device wafer 60 onto composite carrier 32 in accordance with some embodiments. The respective process is illustrated as process 204 in the process flow 200 as shown in FIG. 24. The bonding may include fusion bonding, wherein Si—O—Si bonds are formed to join bond layer 30 of composite carrier 32 to bond layer 34 of device wafer 60. In accordance with some embodiments of the present disclosure, device wafer 60 may include a plurality of chips/dies 60' therein, with one of chips 60' illustrated. In accordance with some embodiments of the present disclosure, device dies 60' are logic dies, which may be Central Processing Unit (CPU) dies, Graphics Processing Unit (GPU) dies, Micro Control Unit (MCU) dies, Base-Band (BB) dies, Application processor (AP) dies, or the like. Device wafer 60 may include semiconductor substrate 36, and integrated circuit devices 40 formed on substrate 36. Bond layer 34 is formed underlying semiconductor substrate 36, and may be formed of a silicon-containing dielectric material such as silicon oxide, silicon oxynitride, silicon carbide, silicon nitride, or the like.

Semiconductor substrate 36 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. In accordance with some embodiments, through-vias 38 (sometimes referred to as Through-Silicon Vias (TSVs) or through-semiconductor vias) may be formed to extend into semiconductor substrate 36, wherein the through-vias are used to electrically inter-couple the features on opposite sides of semiconductor substrate 36.

Integrated circuit devices 40 are alternatively referred to as Front-End-of-Line (FEOL) in accordance with some embodiments. Integrated circuit devices 40 may include active devices such as transistors and diodes, and may or may not include passive devices such as capacitors, resistors, or the like.

In accordance with alternative embodiments, instead of forming composite carrier 32, and bonding device wafer 60 to composite carrier 32, a wafer including layers 20, 22, 24, 26, 28, 30, and substrate 36 are formed first, and integrated circuit devices 40 are formed on the surface of substrate 36.

Over Integrated devices 40, Middle-End-of-Line (MEOL) and Back-Front-End of-Line (BEOL) structures are formed, which are also referred to as interconnect structure 42. Interconnect structure 42 may include Inter-Layer Dielectric (ILD) 44, and contact plugs 46 formed in ILD 44. In accordance with some example embodiments, ILD 44 is formed of or comprises PSG, BSG, BPSG, FSG, silicon oxide, or the like. ILD 44 may be formed using spin coating, Flowable Chemical Vapor Deposition (FCVD), CVD, PECVD, or the like.

Contact plugs 46 are formed in ILD 44, and are used to electrically connect integrated circuit devices 40 to overlying metal lines and vias. In accordance with some embodiments of the present disclosure, contact plugs 46 are formed of a conductive material selected from tungsten, cobalt, aluminum, copper, titanium, tantalum, titanium nitride, tantalum nitride, alloys thereof, and/or multi-layers thereof.

Interconnect structure 42 further includes metal lines 50 and vias 52, which are referred to as BEOL in accordance with some embodiments. Metal lines 50 and vias 52 are formed in dielectric layers 48. Dielectric layers 48 are alternatively referred to as Inter-Metal Dielectric (IMD) layers 48 hereinafter. In accordance with some embodiments of the present disclosure, at least some or all of dielectric layers 48 are formed of a low-k dielectric material having a dielectric constant (k-value) lower than about 3.0. Dielectric layers 48 may be formed of a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 48 are formed of non-low-k dielectric materials. Etch stop layers (not shown), which may be formed of silicon carbide, silicon nitride, silicon oxynitride, aluminum oxide, aluminum nitride, or combinations thereof, are formed between IMD layers 48, and are not shown for simplicity.

Surface dielectric layer 56 may be formed at the surface of wafer 60. Surface dielectric layer 56 may be formed of a non-low-k dielectric material such as silicon oxide, and may be in physical contact with the underlying low-k dielectric layer 48 in accordance with some embodiments. Surface dielectric layer 56 may have a single-layer structure or a composite structure including more than one layer, which may be formed of silicon oxide, silicon nitride, Undoped Silicate Glass (USG), or the like. Surface dielectric layer 56 is alternatively referred to as a passivation layer since it has the function of isolating the underlying low-k dielectric layers (if any) from the adverse effect of detrimental chemicals and moisture.

Figure 3:
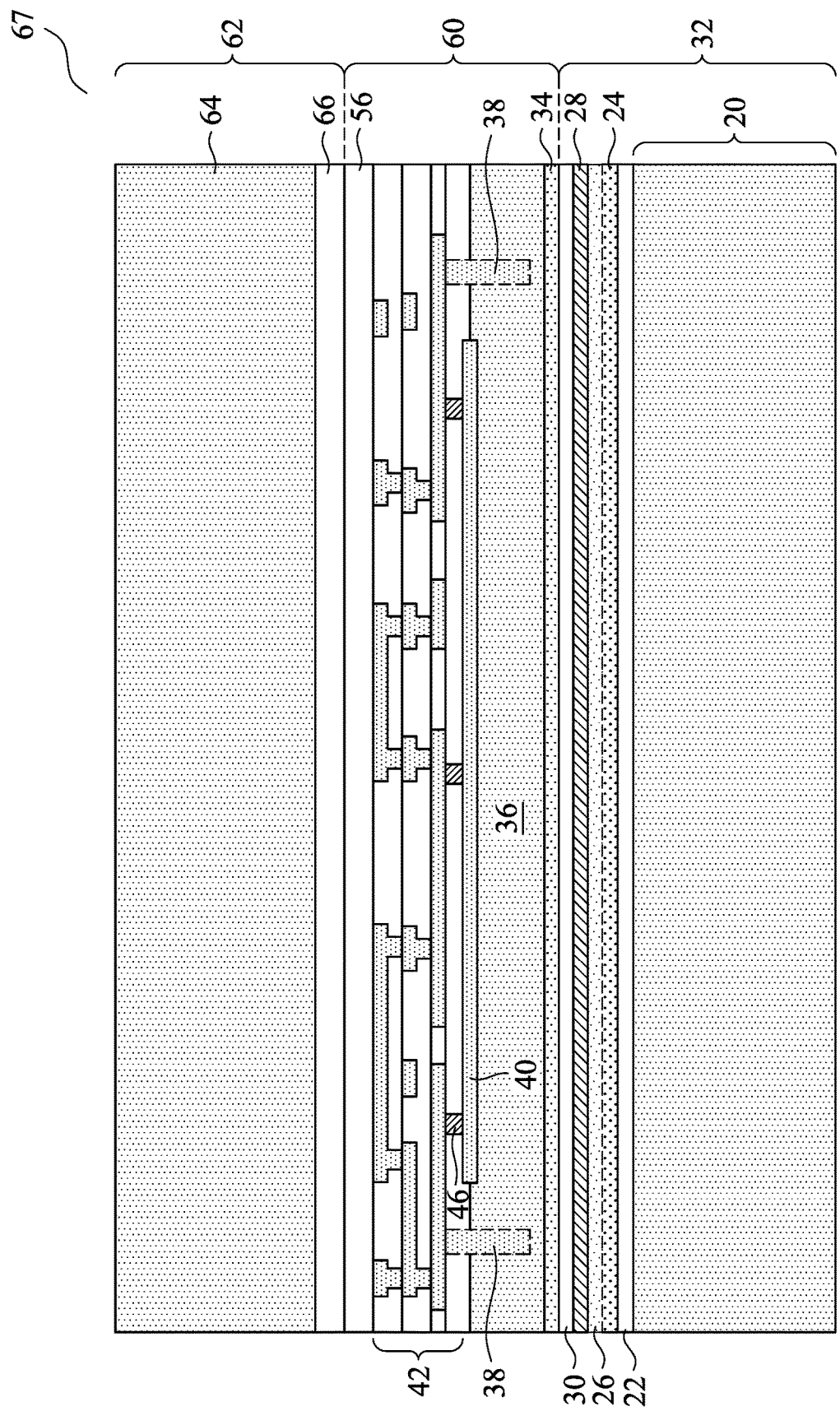

Referring to FIG. 3, carrier 62 is bonded to wafer 60. The respective process is illustrated as process 206 in the process flow 200 as shown in FIG. 24. In accordance with some embodiment, carrier 62 includes base carrier 64, and bond layer 66 on base carrier 64. Carrier 62 may be formed of or comprises silicon, glass, or the like. In accordance with some embodiments, carrier 62 is left in the final structure, and is sawed apart as parts of the respective package. Accordingly, carrier 62 may have the structure shown in FIG. 3, or may have the structure shown in FIG. 1A or FIG. 1B. In accordance with alternative embodiments, carrier 62 is de-bonded in a subsequent process, and thus may have the structure shown in FIG. 1A or FIG. 1B.

Figure 4:
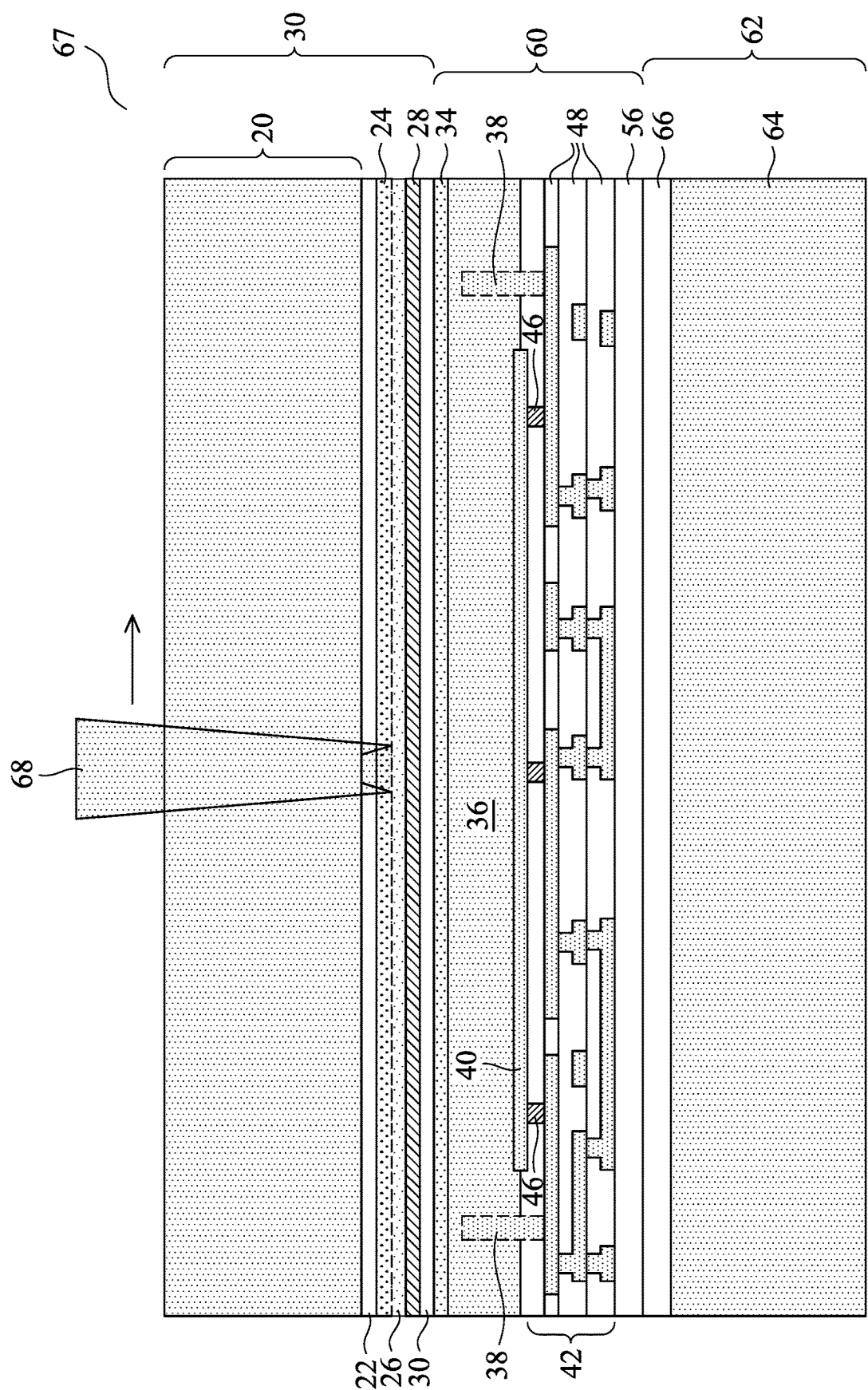

Bond layer 66 may be formed of or comprise a silicon-containing dielectric material such as silicon oxide, silicon oxynitride, silicon carbo-nitride, or the like. The bonding may include fusion bonding, wherein Si—O—Si bonds are formed to join bond layer 66 and dielectric layer 56 with each other. Throughout the description, the structure shown in FIG. 4 is referred to as composite wafer 67.

Referring to FIG. 3, composite wafer 67 is flipped upside down, and a laser de-bonding process is performed to de-bond base carrier 20 from wafer 60. The respective process is illustrated as process 208 in the process flow 200 as shown in FIG. 24. Laser beam 68 is projected on composite wafer 67 to ablate absorption layer 24, so that base carrier 20 is de-bonded from wafer 60. Laser beam 68 has a wavelength that allows it to penetrate through base carrier 20, layer 22, and pad layer 26 without being substantially absorbed by these layers. Furthermore, laser beam 68 has the wavelength that allows it to be absorbed by absorption layer 24 with relatively high absorptance, for example, with an absorptance value being greater than about 10 percent, about 20 percent or about 35 percent, depending on the material, the structure of absorption layer 24, and the wavelength. Laser beam 68 also has the wavelength that allows it to be reflected by reflection layer 28 (if formed), with a high reflectance, for example, greater than about 80 percent or 90 percent.

Figure 19:
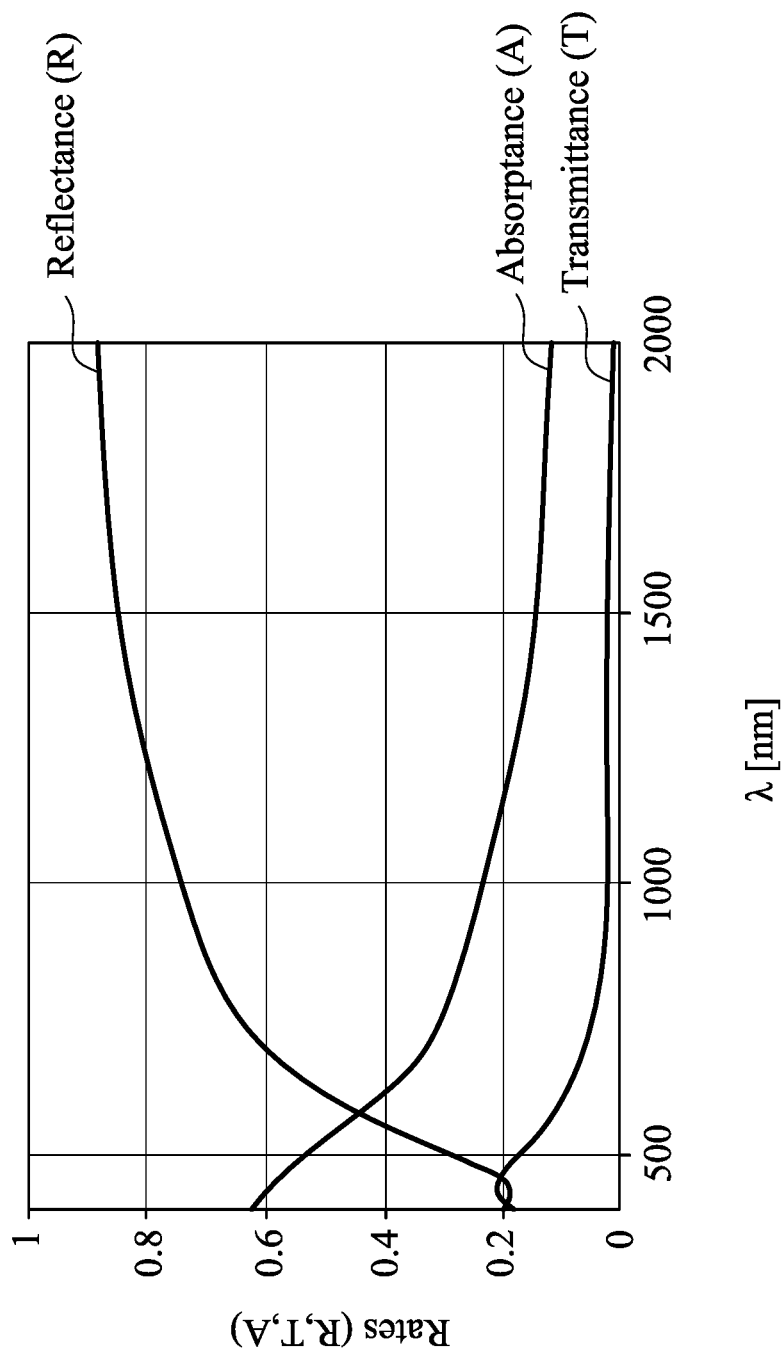
FIG. 19 illustrates the reflectance, absorptance, and transmittance of titanium nitride films as a function of wavelength in accordance with some embodiments.

FIG. 19 illustrates the reflectance, absorptance, and transmittance of TiN layers as functions of laser wavelength. The thickness of the corresponding sample TiN layer is 63 nm. It is observed that the absorptance is in the range between 12 percent and about 23 percent when the wavelength is in the range between about 1,000 nm and about 2,000 nm, which are usable. Also, the transmittance is in the range between about 70 percent and about 88 percent in this wavelength range, which means that a reflection layer may significantly help the absorption since the reflection layer reflects the laser beam penetrating through absorption layer 24 for a second chance of absorbing. Accordingly, when TiN is used as the absorption layer, the composite carrier as shown in FIG. 1A may be adopted.

Figure 20:
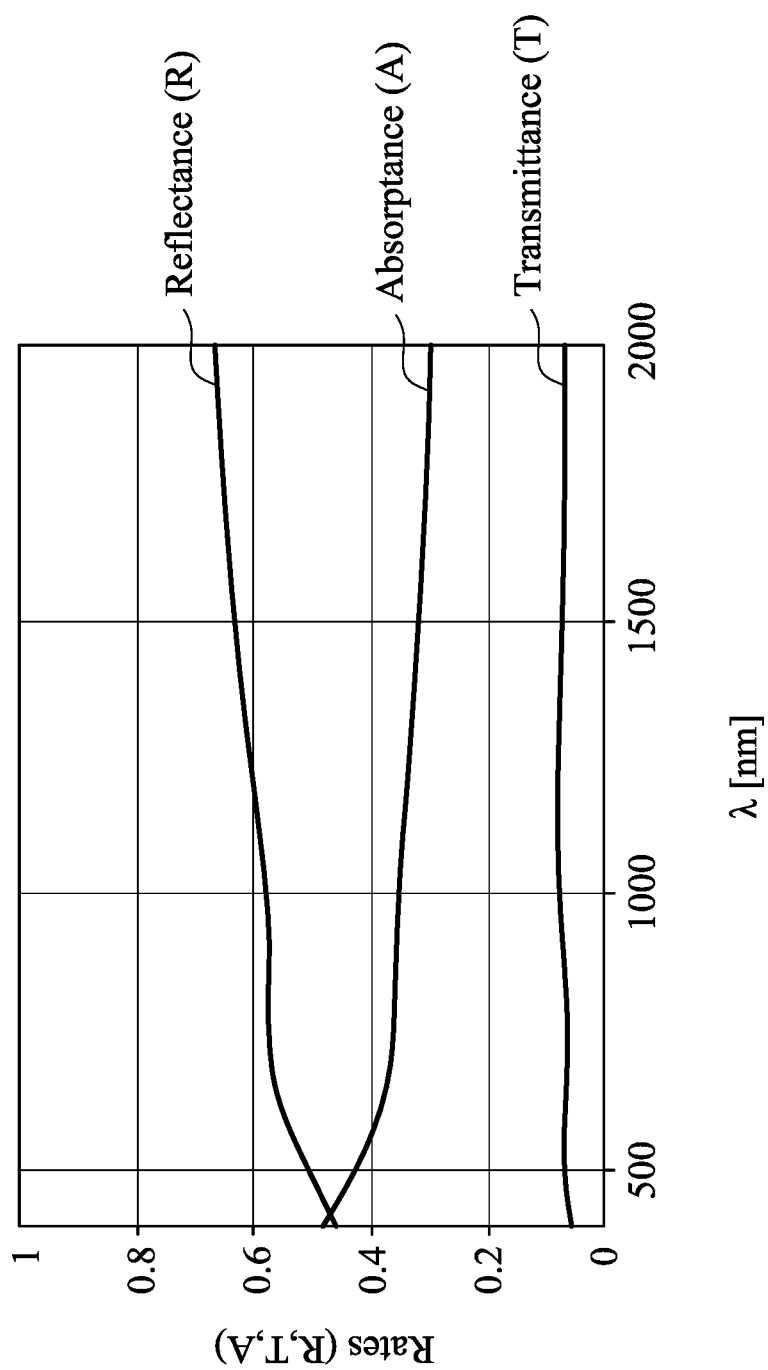
FIG. 20 illustrates the reflectance, absorptance, and transmittance of a TiN/Ti/TiN film as a function of wavelength in accordance with some embodiments.

FIG. 20 illustrates the reflectance R, absorptance A, and transmittance T of TiN/Ti/TiN composite layers as functions of the wavelength of laser beam. It is observed that the absorptance is about 30 percent to 35 percent when the wavelength is in the range between about 1,000 nm and about 2,000 nm, which absorptance is high since the absorption layer is thin and hence the power density is high. The reflectance is in the range between about 58 percent and about 65 percent in this wavelength range. Also, the transmittance is in the range between about 8 percent and about 10 percent in this wavelength range, which means that a reflection layer may not significantly help the absorption. Accordingly, when a TiN/Ti/TiN composite layer is used as the absorption layer, the composite carrier as shown in FIG. 1B may be adopted.

Figure 21:
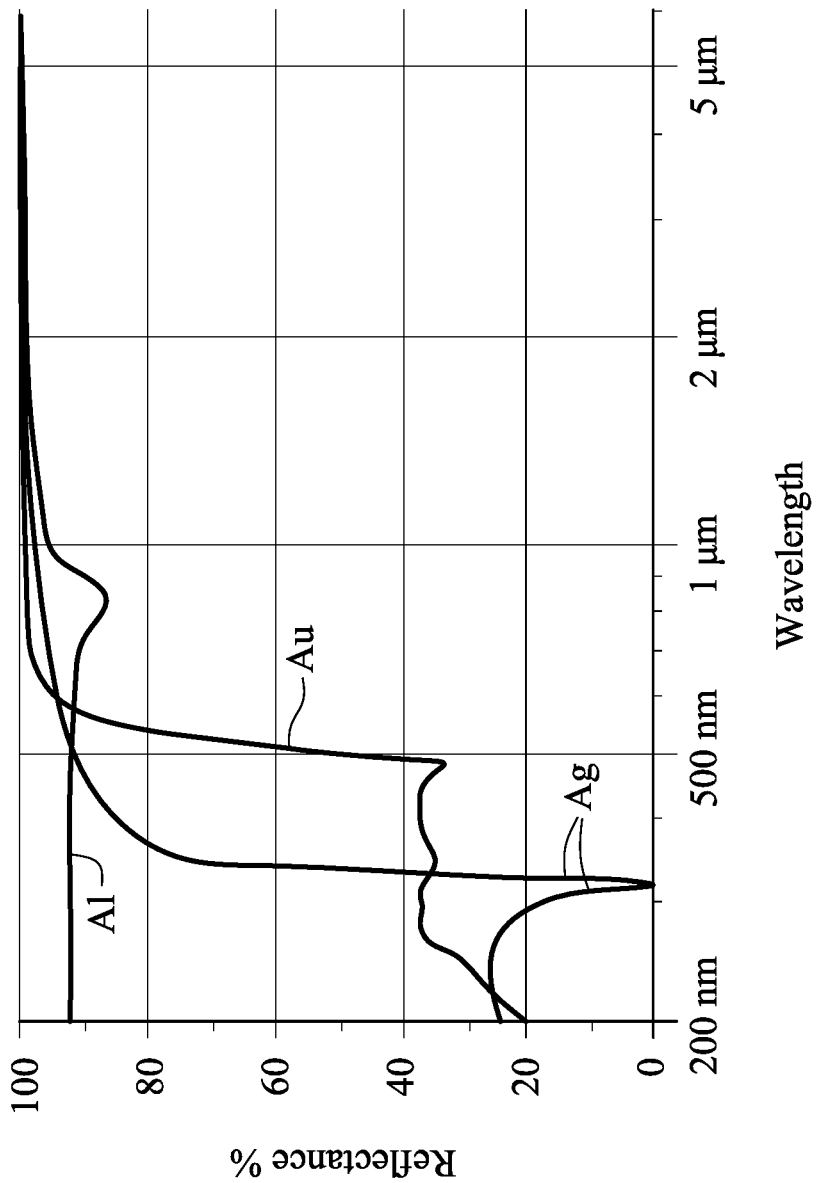
FIG. 21 illustrates the reflectance values of several metals as functions of wavelength in accordance with some embodiments.

FIG. 21 illustrates the reflectance values of aluminum, silver and gold as functions of the wavelength of laser beam. It is shown that when the wavelength is greater than about 1,000 nm (1 μm), the reflectance values are greater than about 95 percent, which indicates that aluminum, silver and gold are good candidates for forming the reflection layer.

Figure 22:
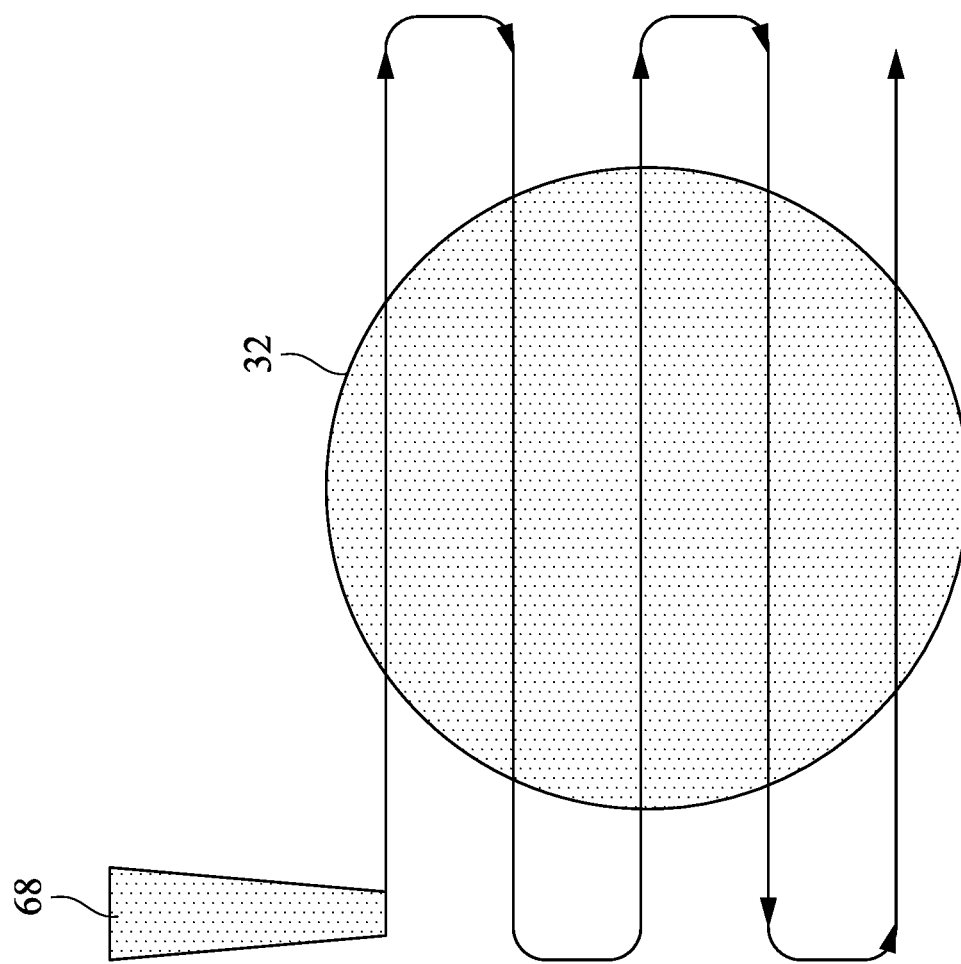
FIGS. 22 and 23 illustrate some scanning paths of a laser beam on a carrier in accordance with some embodiments.
Figure 23:
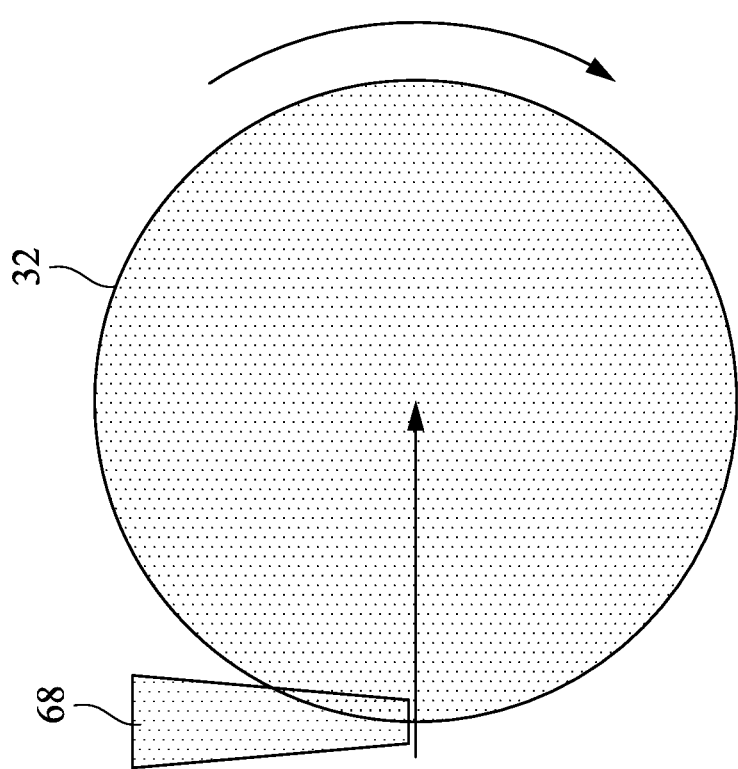

In accordance with some embodiments, as reflected in FIGS. 19, 20, and 21, an Infrared (IR) laser with a wavelength in the range between about 1,800 μm and about 2,200 μm may be used for the de-bonding. FIG. 22 illustrates a first pattern for laser beam 68 to scan-through the entire composite carrier 32, wherein composite carrier 32 is scanned by laser beam 68 back-and-forth, and line-by-line. FIG. 23 illustrates a second pattern for laser beam 68 to scan through composite carrier 32, wherein laser beam 68 moves along a radius of composite carrier 32, while composite carrier 32 is rotated simultaneously, so that the entire composite carrier 32 is scanned by laser beam 68.

The laser spot size (diameter or length/width) may be greater than about 5 nm so that the efficiency of the de-bonding is high enough. Otherwise, it takes too long to scan through composite carrier 32. It is appreciated that the energy of laser beam 68 is limited, and with the increase in the spot size, the power density reduces. Accordingly, the laser spot size cannot be too big either. In accordance with some embodiments, the laser spot size is selected so that the peak power density of the laser beam is in the range between about 1E11 Watt/cm$^2$ and about 1E15 Watt/cm$^2$. Otherwise, the impacted spot of absorption layer 24 may not be ablated successfully.

Laser beam 68 is projected in the form of laser pulse. The laser pulse cannot be too long or too short. If the laser pulse is too short, it cannot generate enough power density in the laser spot, and the projected spot of the absorption layer 24 cannot be ablated. If the laser pulse is too long, the heat carried by the laser beam 68 will cause the temperature of the underlying wafer 60 (FIG. 4) to rise too much and may degrade or damage the circuit and/or the devices therein. In accordance with some embodiments, the laser pulse duration is in the range between about $1 \times 10^{-15}$ seconds and about $1 \times 10^{-9}$ seconds. With the power, the laser spot size, and the laser pulse duration of the laser beam 68 being controlled to be in desirable ranges, the temperature in wafer 60 may be limited to be lower than about 400° C.

Figure 5:
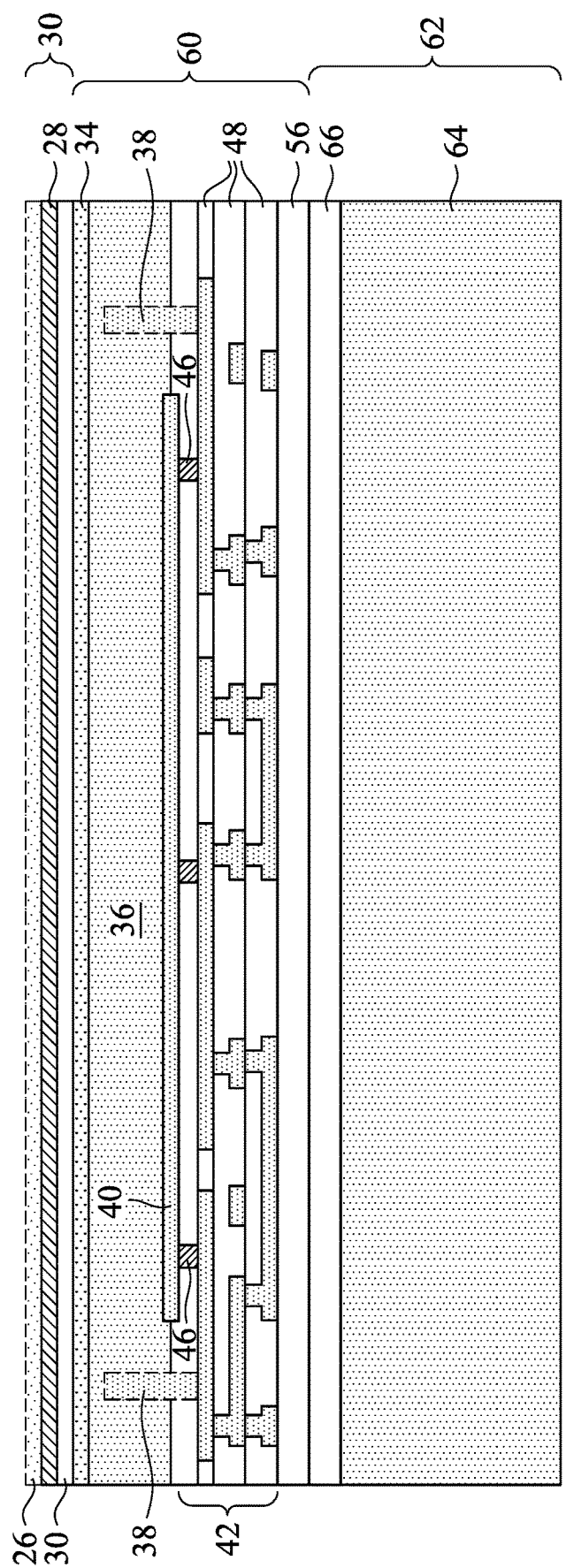

Referring back to FIG. 4, the energy of laser beam 68 is absorbed by absorption layer 24, causing the projected spot of absorption layer 24 to be ablated. During the ablation, the projected spot of absorption layer 24 may be liquidized and vaporized. Also, the laser energy may cause impact on the projected spot, and the liquidized and vaporized portion of absorption layer 24 may be pushed up and down to form a void. With the laser beam 68 being scanned throughout the entire absorption layer 24, the entire absorption layer 24 is ablated. Base carrier 20 and layer 22 may thus be separated from the underlying pad layer 26 (if pad layer 26 and reflection layer 28 are formed) or bond layer 30. The resulting structure is shown in FIG. 5.

Figure 6:
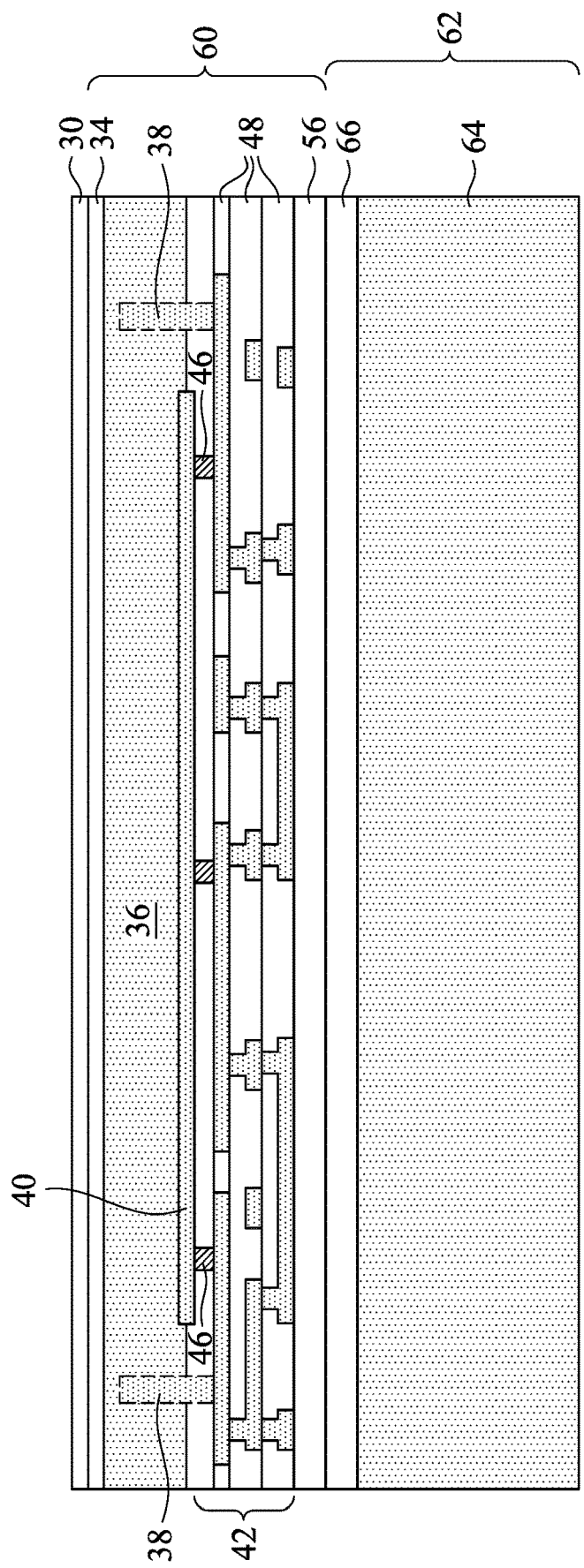

After the de-bonding, the residue absorption layer 24 is removed in a cleaning process. Pad layer 26 and reflection layer 28, if formed, are removed, for example, in etching processes. The respective process is illustrated as process 210 in the process flow 200 as shown in FIG. 24. The resulting structure is shown in FIG. 6. Bond layer 30 may be removed or may remain in the final structure, depending on the materials of bond layers 30 and 34.

Figure 7:
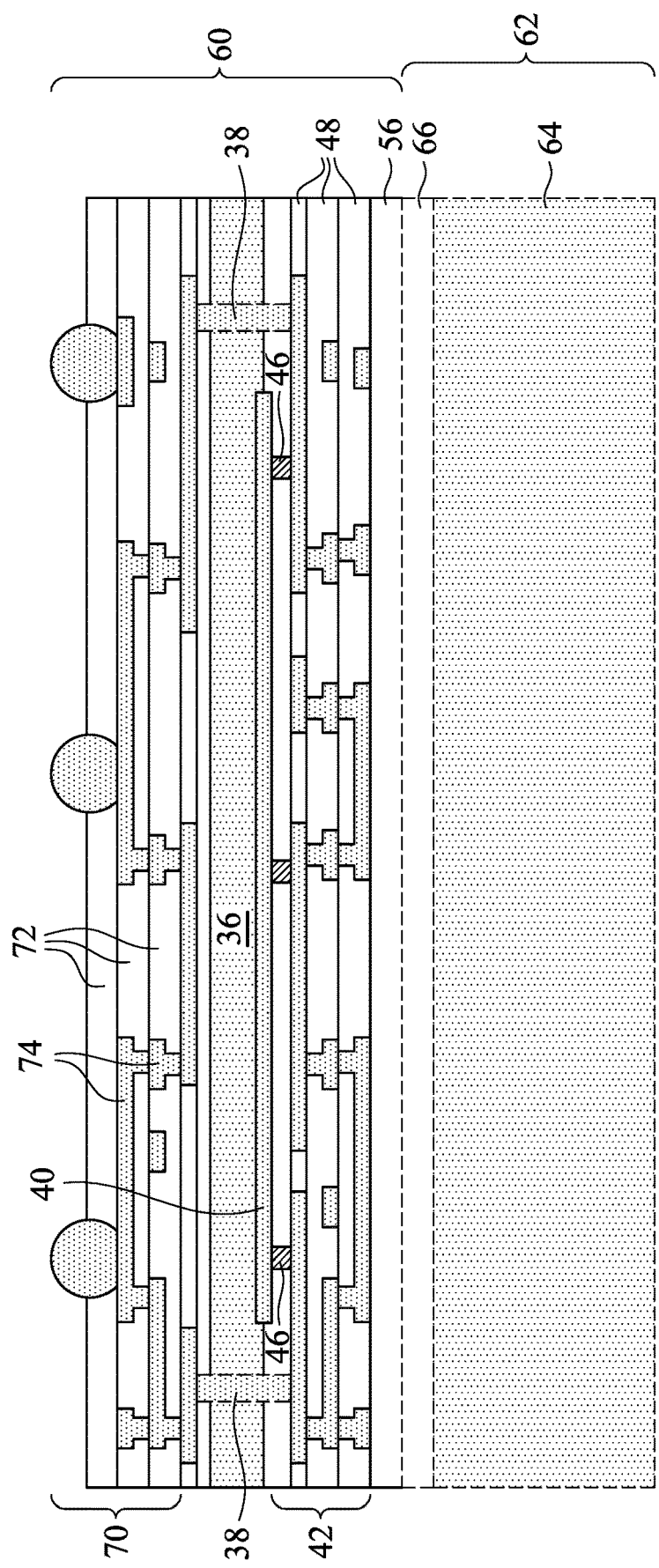

In subsequent processes, conductive features such as Redistribution Lines (RDLs), electrical connectors, etc. may be formed on the backside (the illustrated top side) of substrate 36. An example resulting structure is shown in FIG. 7, as discussed below. Alternatively, the conductive features may be formed on the front side (the illustrated bottom side) of interconnect structure 42. When the conductive features are formed on the front side of substrate 36, carrier 62 may be removed first in order to form the conductive features. In accordance with these embodiments, carrier 62 may have the structure as shown in FIG. 1A or 1B, and may be removed using the same laser ablation process as shown in FIG. 4.

FIG. 7 illustrates the formation of interconnect structure 70 on the backside of substrate 36 in accordance with some embodiments. The respective process is illustrated as process 212 in the process flow 200 as shown in FIG. 24. Interconnect structure 70 includes dielectric layers 72, and RDLs 74 in dielectric layers 72. Electrical connectors, which may include solder regions, may be formed to electrically connect to RDLs 74. RDLs 74 may include Power Distribution Network (PDN) therein, and may also include signal lines.

Wafer 60 may then be singulated to form packages. In accordance with some embodiments, carrier 62 is removed from wafer 60 before the singulation. In accordance with alternative embodiments, carrier 62 is not removed, and remains in the final packages. Accordingly, carrier 62 is shown as being dashed to indicate that it may be removed or may remain in the final packages.

FIGS. 8 through 16 illustrate the cross-sectional views of intermediate stages in the formation of a package on a composite carrier, and the de-bonding of the composite carrier in accordance with some embodiments of the present disclosure. Unless specified otherwise, the materials and the formation processes of the components in these embodiments are essentially the same as the like components, which are denoted by like reference numerals in the preceding embodiments shown in FIGS. 1A, 1B, and 2-7. The details regarding the formation process and the materials of the components shown in FIGS. 8 through 16 may thus be found in the discussion of the preceding embodiments.

Figure 8:
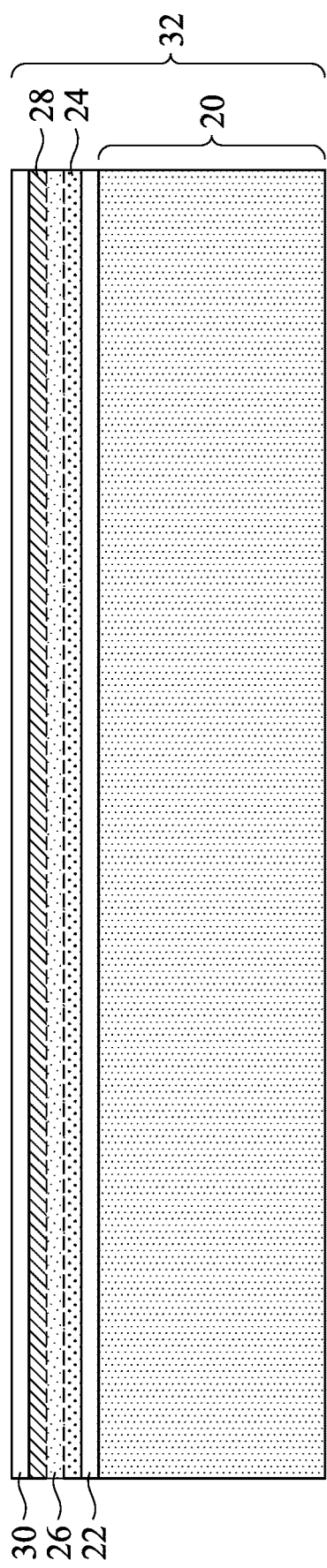
FIGS. 8 through 16 illustrate the cross-sectional views of intermediate stages in a packaging process on a composite carrier and the de-bonding of the composite carrier from the resulting package in accordance with some embodiments.

Referring to FIG. 8, composite carrier 32 is provided. The structure, the formation processes, and the materials of composite carrier 32 have been discussed referring to FIGS. 1A and 1B, and hence are not repeated herein.

Figure 9:
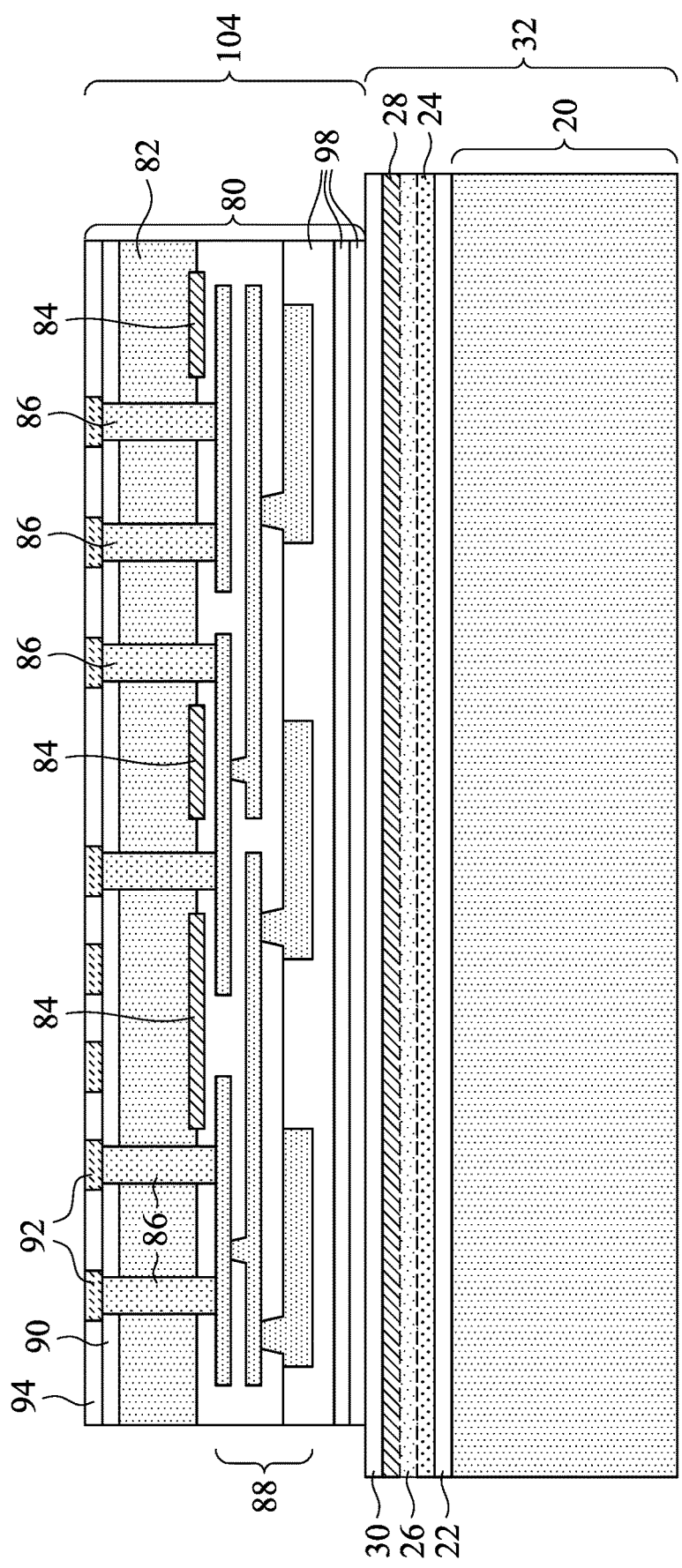

Referring to FIG. 9, tier-1 package component(s) 80 are bonded to composite carrier 32 through fusion bonding. In accordance with some embodiments, there is a single package component 80 bonded to composite carrier 32. Accordingly, package component 80 may be an un-sawed device wafer, an un-sawed reconstructed wafer (with discrete device dies packaged therein), or the like. In accordance with alternative embodiments, a plurality of package components 80 are bonded to composite carrier 32. The plurality of package components 80 may be discrete package components physically separate from each other. In accordance with some embodiments, package components 80 are selected from device dies, packages with device die packaged therein, System-on-Chip (SoC) dies including a plurality of integrated circuits (or device dies) integrated as a system, or the like, or combinations thereof. The device dies in package components 80 may be or may comprise logic dies, memory dies, input-output dies, Integrated Passive Devices (IPDs), or the like, or combinations thereof. For example, the logic device dies in package components 80 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 80 may include Static Random Access Memory (SRAM) dies, Dynamic Random Access Memory (DRAM) dies, or the like. The device dies in package components 80 may include semiconductor substrates and interconnect structures.

In accordance with some embodiments, a package component 80 may include substrate 82, integrated circuit devices 84 at a surface of substrate 82, and through-substrate vias 86 penetrating through substrate 82. Substrate 82 may be a semiconductor substrate such as a silicon substrate. Integrated circuit devices 84 may include active devices, passive device, and the like. Interconnect structure 88 is on the front side of package component 80, and include metal lines and vias electrically connected to through-vias 86 and integrated circuit devices 84. Through-vias 86 may have top portions protruding out of the back surface (the illustrated top surface) of substrate 82, and the top portions are in dielectric layer 90. Bond pads 92 are electrically connected to through-vias 86, and are in dielectric layer 94.

In accordance with some embodiments, the bonding of package components 80 to composite carrier 32 is through fusion bonding, wherein bond layer 30 is bonded to a surface dielectric layer 98 in package component 80, for example, with Si—O—Si bonds being formed.

Figure 10:
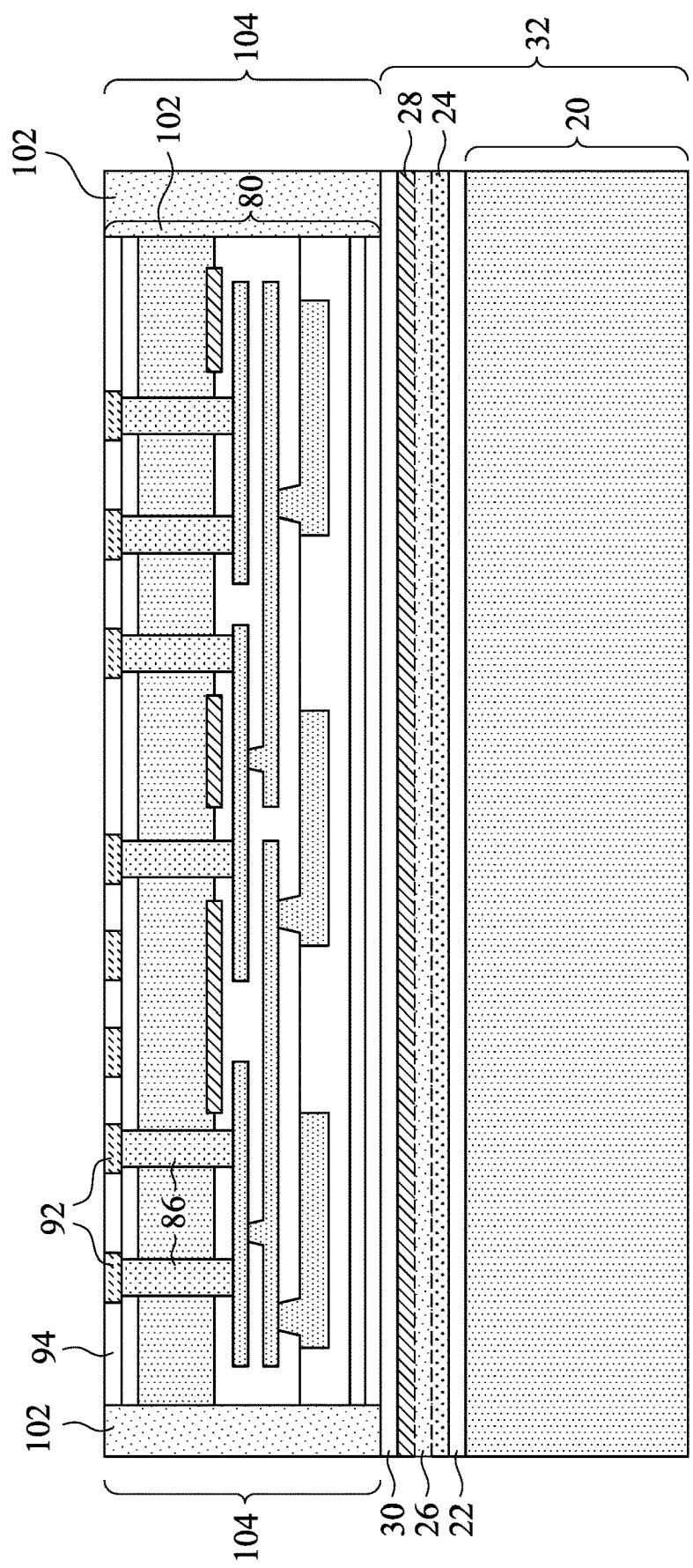

FIG. 10 illustrates the deposition of gap-filling material (regions) 102 (when discrete package components 80 are bonded) to encapsulate package components 80. In accordance with some embodiments in which package components 80 are in an unsawed wafer, the gap-filling process may be skipped. In accordance with some embodiments, gap-filling regions 102 are formed of or comprise inorganic materials. For example, the formation of gap-filling regions 102 may include depositing a dielectric liner (such as a silicon nitride layer) and a dielectric material (such as silicon oxide) over the dielectric liner. In accordance with alternative embodiments, gap-filling regions 102 are formed of a molding compound, an epoxy, a resin, and/or the like. A planarization process such as a CMP process or a mechanical grinding process is performed to level the back surface (the illustrated top surface) of package components 80 with the top surface of gap-filling regions 102. Throughout the description, package components 80 and gap-filling regions 102 are collectively referred to as reconstructed wafer 104. Gap-filling regions 102 encircle the corresponding package components 80 when viewed in a top view of the reconstructed wafer 104.

Figure 11:
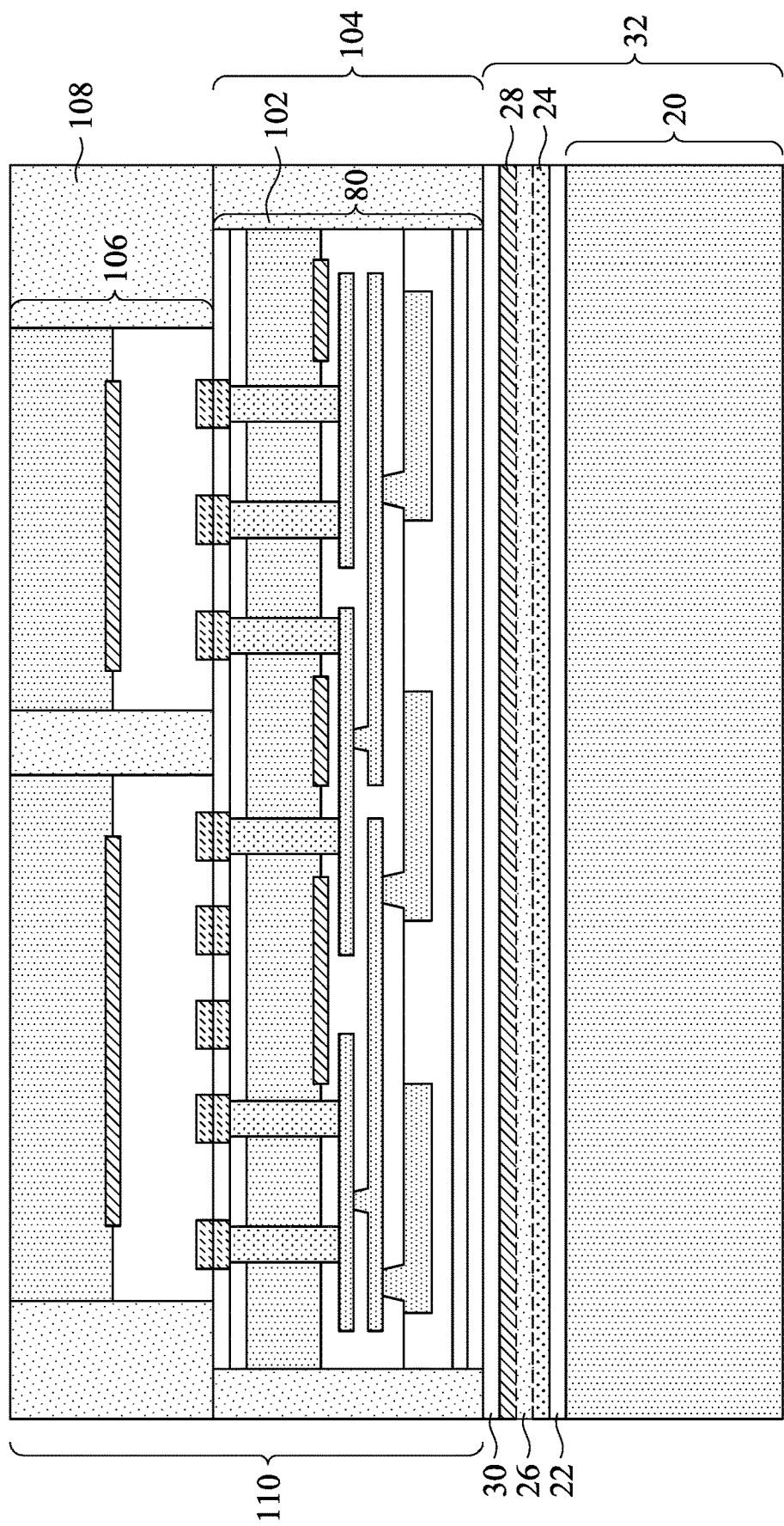

FIG. 11 illustrates the bonding of tier-2 package components 106 to reconstructed wafer 104. Although one group of package components 106, which include two package components 106, is illustrated as an example, a plurality of group of package components 106 may be bonded, each to one of package components 80 in reconstructed wafer 104. The bonding of package components 106 to reconstructed wafer 104 may be achieved through hybrid bonding, in which both of metal-to-metal direct bonding and dielectric-to-dielectric bonding (which form Si—O—Si bonds) are formed. In accordance with some embodiments, package components 106 include device dies, packages, or the like.

FIG. 11 further illustrates the gap-filling of package components 106 in gap-filling regions 108. The formation methods and materials of gap-filling regions 108 may be found from the candidate methods and candidate materials of gap-filling regions 102, and hence are not repeated. Throughout the description, package components 80 and 106 and gap-filling regions 102 and 106 are collectively referred to as reconstructed wafer 110.

Figure 12:
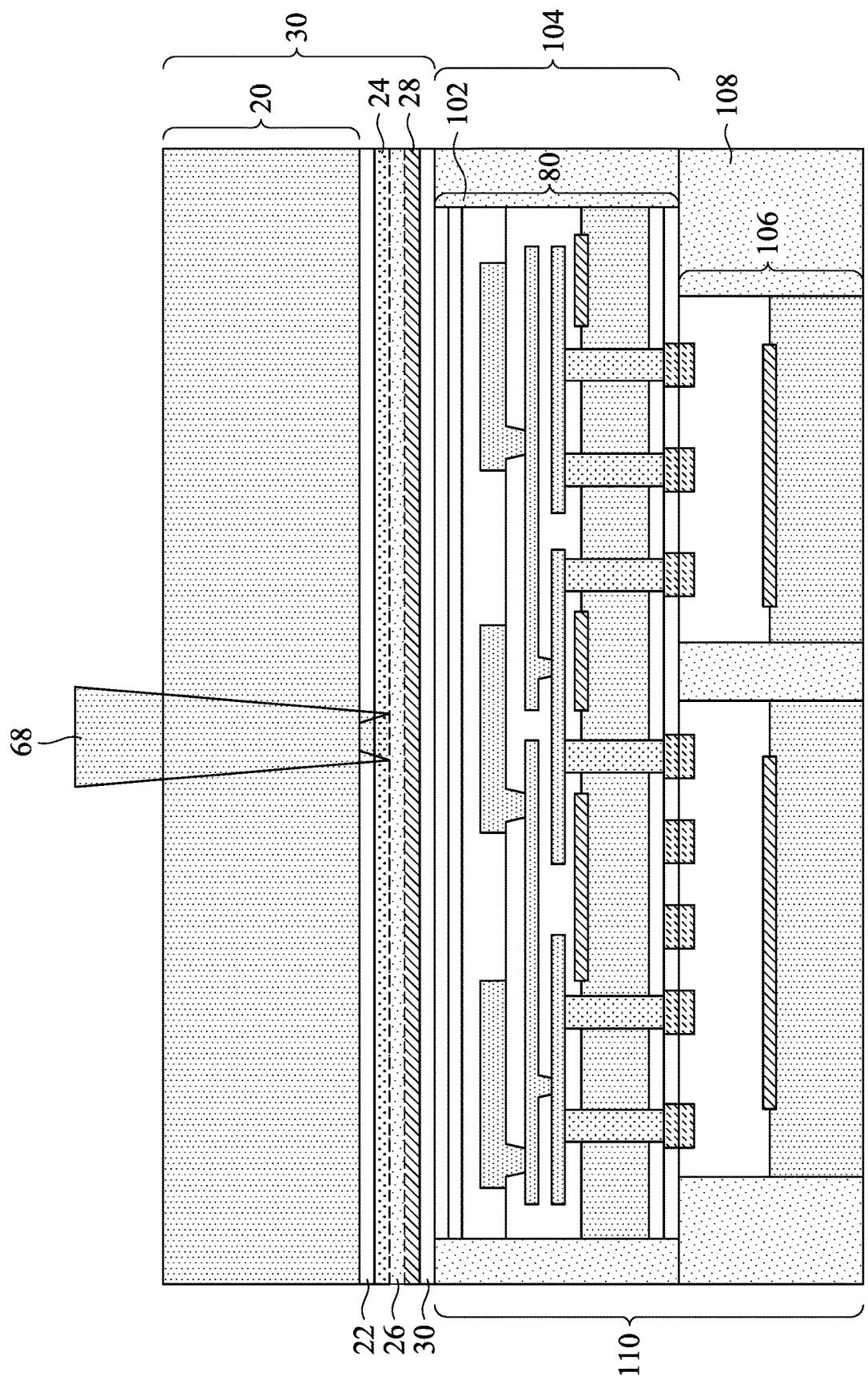
Figure 13:
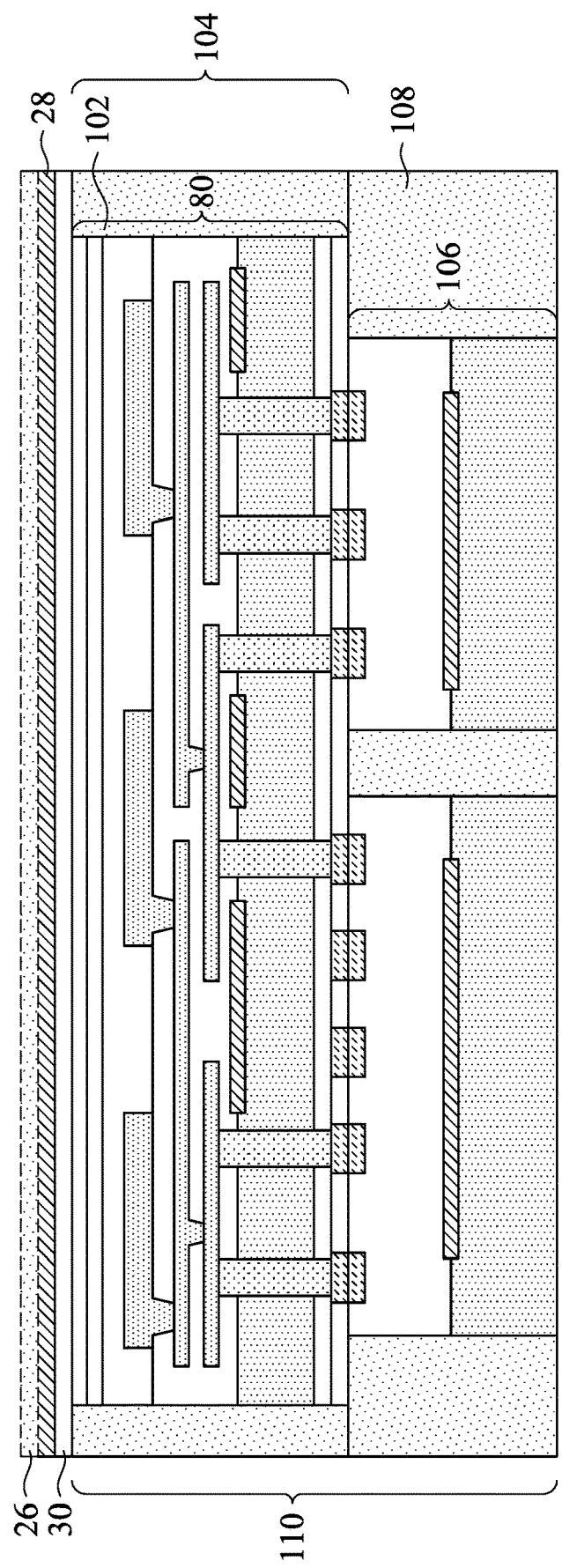

FIG. 12 illustrates the de-bonding of composite carrier 32 from reconstructed wafer no. The de-bonding may be performed through laser beam 68, which is projected onto composite carrier 32. Laser beam 68 penetrates through base carrier 20 and layer 22 to reach absorption layer 24, which is ablated by laser beam 68. The de-bonding process may be essentially the same as what are discussed referring to the preceding embodiments, and is not repeated herein. FIG. 13 illustrates the resulting structure with base carrier 20 being removed.

Figure 14:
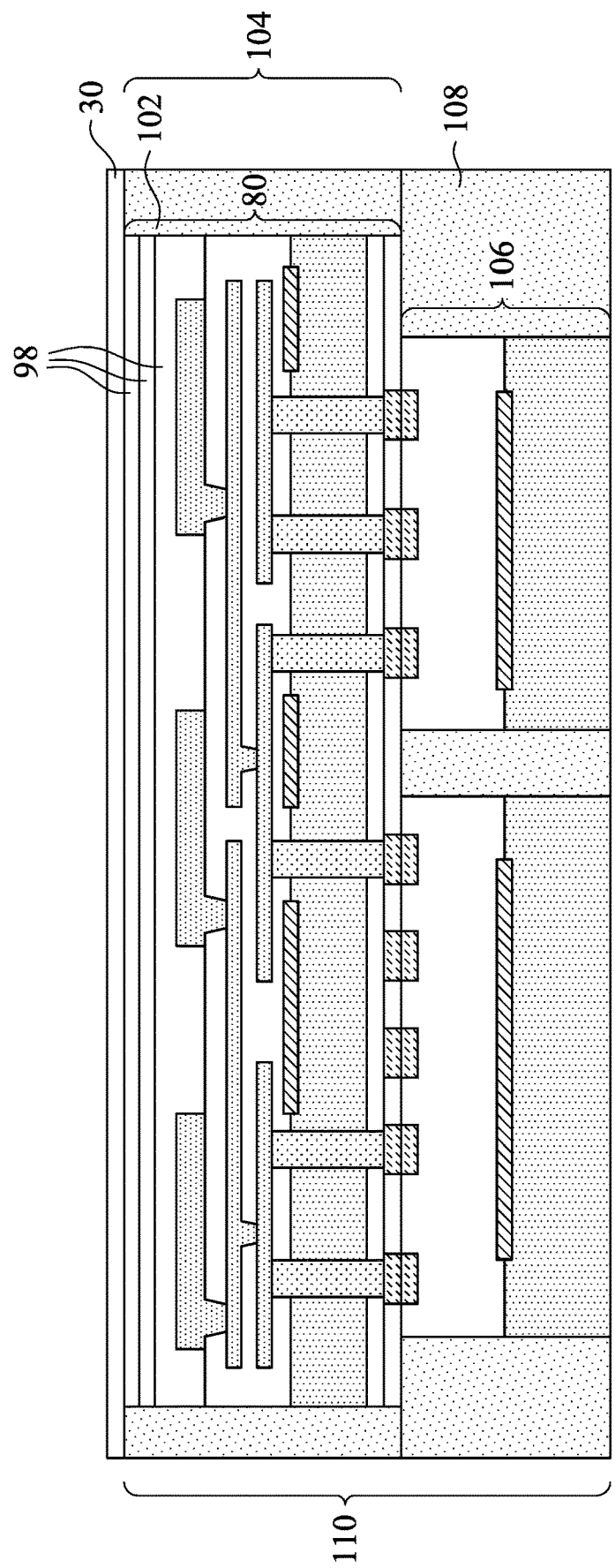
Figure 15:
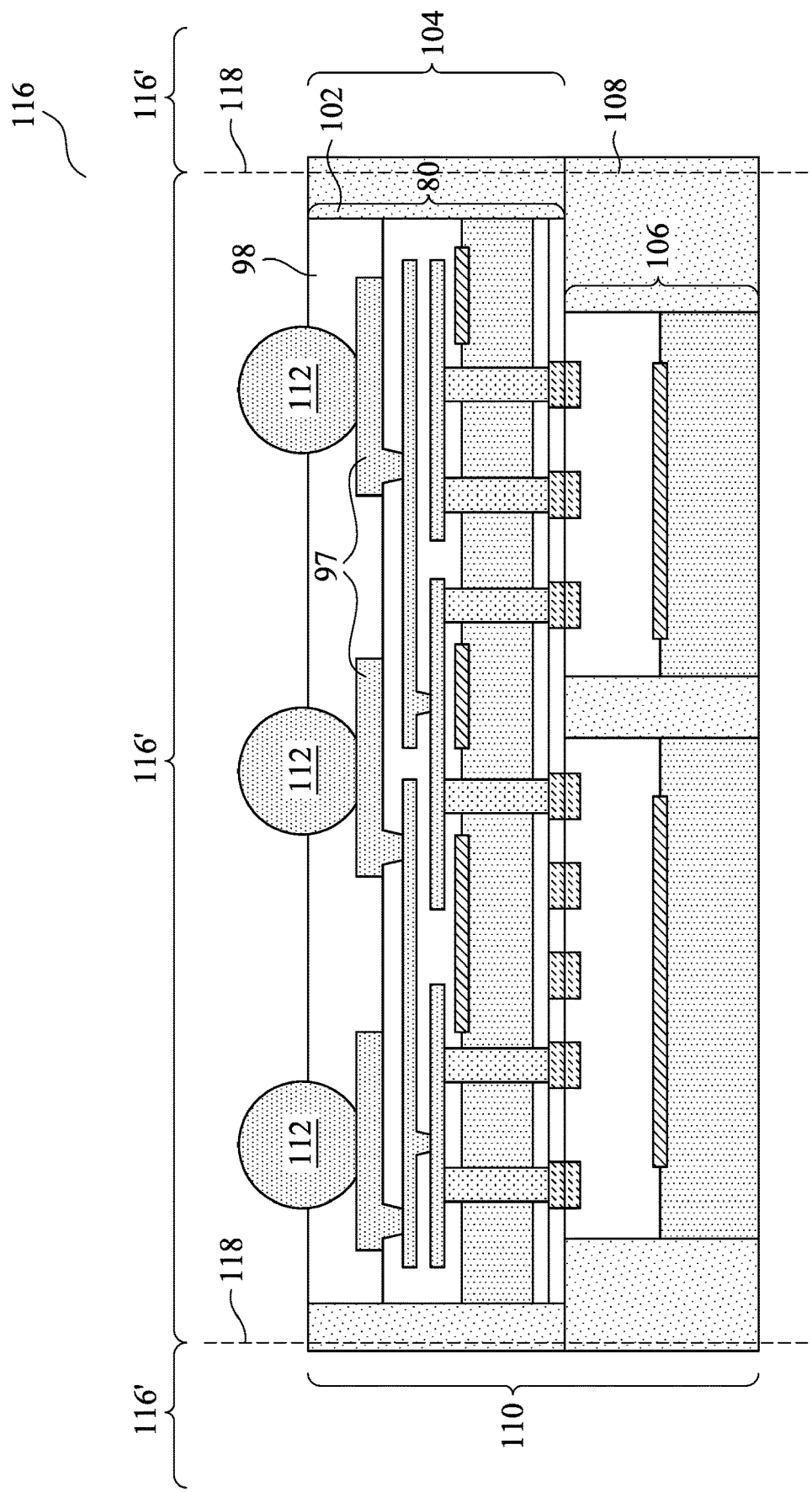

FIG. 14 illustrates the structure after the removal of pad layer 26 and reflection layer 28. Bond layer 30 may be removed (along with the surface bond layers in package components 80), as shown in FIG. 15. In accordance with alternative embodiments, bond layer 3o may be left in the final structure, depending on the material. In accordance with yet alternative embodiments, bond layer 30 and some surface layers in dielectric layers 98 may be removed in a polishing process, and the resulting layers are as shown in FIG. 15 as an example.

FIG. 15 illustrates the pad-opening process, in which openings (occupied by electrical connectors 112) are formed in dielectric layer 98. In accordance with some embodiments, the openings are formed through a photo lithography process, and dielectric layer 98 is etched to form the openings, with metal pads 97 in package component 80 being exposed to the openings.

FIG. 15 also illustrates the formation of electrical connectors 112. In accordance with some embodiments, electrical connectors 112 comprise solder regions, which may be formed by placing solder balls into the openings, and then reflowing the solder balls to form solder regions. In accordance with alternative embodiments, electrical connectors 112 comprise metal posts, which may be formed through plating. The structure shown in FIG. 15 is referred to as reconstructed wafer 116. A singulation process may be performed to saw reconstructed wafer 116 along scribe lines 118 and to form discrete packages 116', which are identical to each other.

Figure 16:
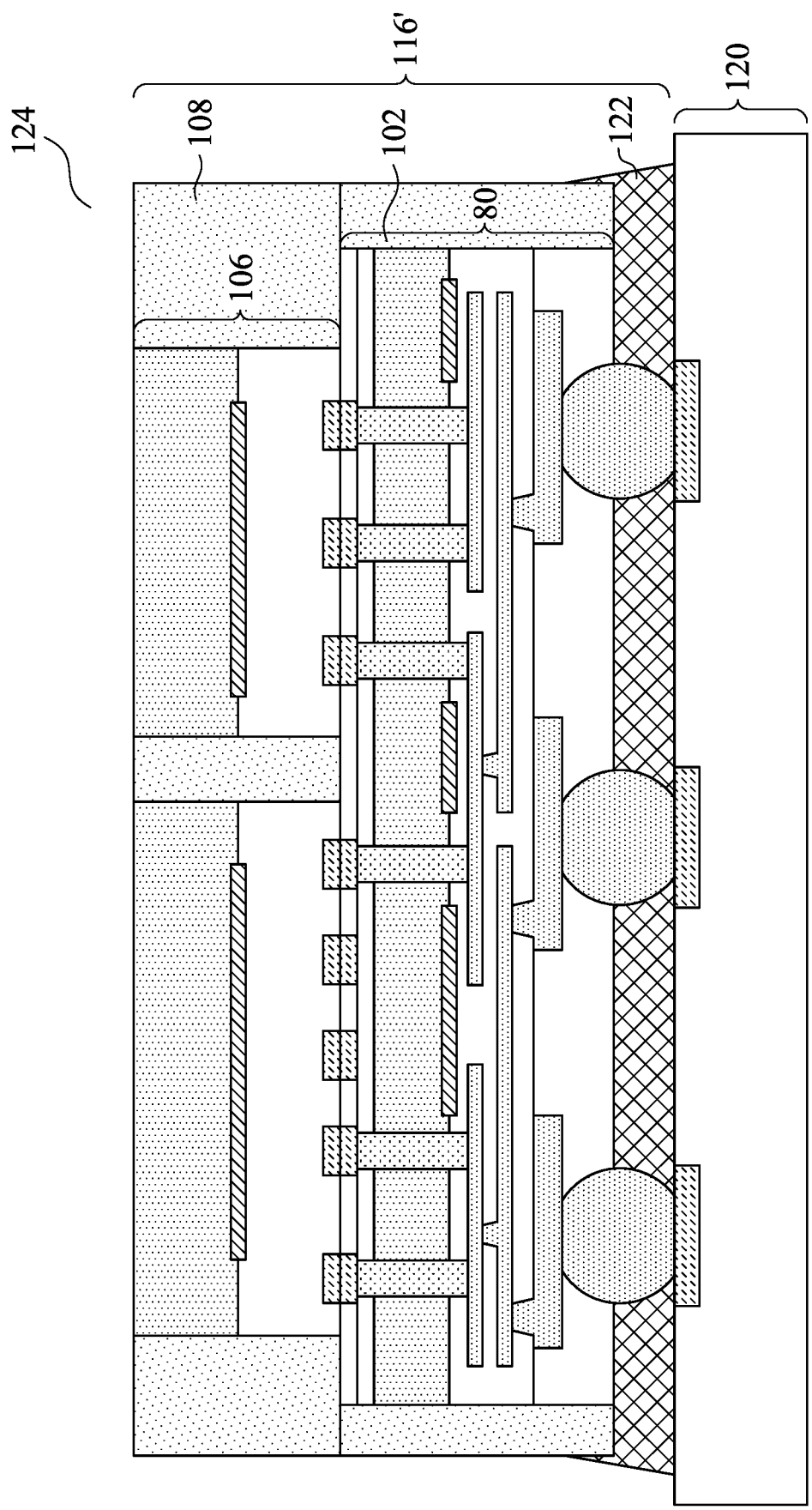

FIG. 16 illustrates the bonding of package 116' to package component 120 to form package 124. Package component 120 may be a package substrate, an interposer, a package, a printed circuit board, or the like. Underfill 122 is dispensed between package 116' and package component 120.

The embodiments of the present disclosure have some advantageous features. By using laser de-bonding process, the permanently bonded base carrier, which is bonded through fusion bonding, may be de-bonded without being damaged. The base carrier can be reused. The cost is reduced. The throughput is improved since the laser de-bonding process is faster than using CMP to remove carrier. The uniformity is also improved since the de-bonding interface is limited to the absorption layer.

In accordance with some embodiments of the present disclosure, a method comprises bonding a package component to a composite carrier, wherein the composite carrier comprises a base carrier; and an absorption layer, wherein the absorption layer is between the base carrier and the package component; projecting a laser beam onto the composite carrier, wherein the laser beam penetrates through the base carrier to ablate the absorption layer; and separating the base carrier from the package component. In an embodiment, the composite carrier further comprises a reflection layer between the absorption layer and the package component, and wherein the reflection layer reflects the laser beam back to the absorption layer. In an embodiment, the absorption layer comprises a metal. In an embodiment, the absorption layer comprises titanium nitride. In an embodiment, the absorption layer comprises a TiN/Ti/TiN composite layer. In an embodiment, the laser beam has a wavelength in a range between about 1,800 nm and about 2,200 nm. In an embodiment, the base carrier comprises a first silicon substrate, and the package component comprises a second silicon substrate. In an embodiment, the method further comprises encapsulating the package component in a gap-filling material, wherein the package component comprises a first device die; bonding a second device die to the first device die, wherein the laser beam is projected after the second device die is bonded; and after the base carrier is separated from the package component, performing a singulation process to form a package, wherein the first device die and the second device die are in the package. In an embodiment, the bonding the package component to the composite carrier comprises fusion bonding.

In accordance with some embodiments of the present disclosure, a structure includes a composite carrier comprising a silicon substrate; a transparent layer; an absorption layer over the transparent layer, wherein the absorption layer comprises titanium; and a bond layer over the absorption layer, wherein an entirety of each of the transparent layer, the absorption layer, and the bond layer is a planar layer. In an embodiment, the transparent layer comprises silicon oxide, and the absorption layer comprises a metal. In an embodiment, the absorption layer comprises titanium. In an embodiment, the absorption layer comprises titanium nitride. In an embodiment, the absorption layer comprises a composite layer comprising a first titanium nitride layer; a titanium layer over the first titanium nitride layer; and a second titanium nitride layer over the titanium layer. In an embodiment, the structure further comprises a pad layer over the absorption layer; and a reflection layer over the pad layer, wherein the pad layer and the reflection layer are between the bond layer and the absorption layer. In an embodiment, the structure further comprises a device die bonding to the composite carrier, wherein the device die comprises an additional bond layer bonding to the bond layer through fusion bonding.

In accordance with some embodiments of the present disclosure, a structure configured to be de-bonded by a laser beam comprises a base carrier, wherein an entirety of the base carrier is formed of a homogeneous material, and wherein the base carrier is transparent to the laser beam; a metal-containing absorption layer over the base carrier, wherein the metal-containing absorption layer is configured to absorb the laser beam; a metal-containing reflection layer over the metal-containing absorption layer, wherein the metal-containing reflection layer is configured to reflect the laser beam; and a bond layer over the metal-containing reflection layer. In an embodiment, the metal-containing absorption layer comprises a first titanium nitride layer. In an embodiment, the metal-containing absorption layer comprises a titanium layer and a second titanium nitride layer, wherein the titanium layer is between and physically contacting the first titanium nitride layer and the second titanium nitride layer. In an embodiment, the metal-containing reflection layer comprises aluminum, silver, or gold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a package component to a composite carrier, wherein the composite carrier comprises:
   a base carrier; and
   an absorption layer, wherein the absorption layer is between the base carrier and the package component, and wherein the absorption layer comprises a titanium nitride layer;
   projecting a laser beam onto the composite carrier, wherein the laser beam penetrates through the base carrier to ablate the absorption layer; and
   separating the base carrier from the package component.

2. The method of claim 1, wherein the composite carrier further comprises a reflection layer between the absorption layer and the package component, and wherein the reflection layer reflects the laser beam back to the absorption layer.

3. The method of claim 1, wherein the absorption layer further comprises a metal layer contacting the titanium nitride layer.

4. The method of claim 3, wherein the absorption layer comprises a TiN/Ti/TiN composite layer.

5. The method of claim 1, wherein the laser beam has a wavelength in a range between about 1,800 nm and about 2,200 nm.

6. The method of claim 1, wherein the base carrier comprises a first silicon substrate, and the package component comprise a second silicon substrate.

7. The method of claim 1 further comprising:
   encapsulating the package component in a gap-filling material, wherein the package component comprises a first device die;
   bonding a second device die to the first device die, wherein the laser beam is projected after the second device die is bonded; and
   after the base carrier is separated from the package component, performing a singulation process to form a package, wherein the first device die and the second device die are in the package.

8. The method of claim 1, wherein the bonding the package component to the composite carrier comprises fusion bonding.

9. A structure comprising:
   a composite carrier comprising:
   a silicon substrate;
   a transparent layer;
   an absorption layer over the transparent layer, wherein the absorption layer comprises titanium; and
   a bond layer over the absorption layer, wherein an entirety of each of the transparent layer, the absorption layer, and the bond layer is a planar layer.

10. The structure of claim 9, wherein the transparent layer comprises silicon oxide, and the absorption layer comprises a metal.

11. The structure of claim 10, wherein the absorption layer comprises titanium.

12. The structure of claim 10, wherein the absorption layer comprises titanium nitride.

13. The structure of claim 10, wherein the absorption layer comprises a composite layer comprising:
    a first titanium nitride layer;
    a titanium layer over the first titanium nitride layer; and
    a second titanium nitride layer over the titanium layer.

14. The structure of claim 9 further comprising:
    a pad layer over the absorption layer; and
    a reflection layer over the pad layer, wherein the pad layer and the reflection layer are between the bond layer and the absorption layer.

15. The structure of claim 9 further comprising:
    a device die bonding to the composite carrier, wherein the device die comprises an additional bond layer bonding to the bond layer through fusion bonding.

16. A structure configured to be de-bonded by a laser beam, the structure comprising:
    a base carrier, wherein an entirety of the base carrier is formed of a homogeneous material, and wherein the base carrier is transparent to the laser beam;
    a metal-containing absorption layer over the base carrier, wherein the metal-containing absorption layer is configured to absorb the laser beam;
    a metal-containing reflection layer over the metal-containing absorption layer, wherein the metal-containing reflection layer is configured to reflect the laser beam; and
    a bond layer over the metal-containing reflection layer.

17. The structure of claim 16, wherein the metal-containing absorption layer comprises a first titanium nitride layer.

18. The structure of claim 17, wherein the metal-containing absorption layer comprises a titanium layer and a second titanium nitride layer, wherein the titanium layer is between and physically contacting the first titanium nitride layer and the second titanium nitride layer.

19. The structure of claim 17, wherein the metal-containing reflection layer comprises aluminum, silver, or gold.

20. The method of claim 2, wherein the reflection layer comprises aluminum or copper.

* * * * *